United States Patent
Noguchi et al.

(10) Patent No.: US 7,187,399 B2
(45) Date of Patent: Mar. 6, 2007

(54) EXPOSURE HEAD WITH SPATIAL LIGHT MODULATOR

(75) Inventors: Masaru Noguchi, Kanagawa (JP); Hiromi Ishikawa, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 315 days.

(21) Appl. No.: 10/898,233

(22) Filed: Jul. 26, 2004

(65) Prior Publication Data

US 2005/0024477 A1 Feb. 3, 2005

(30) Foreign Application Priority Data

Jul. 31, 2003 (JP) .............................. 2003-204404

(51) Int. Cl.
*B41J 15/14* (2006.01)
*B41J 27/00* (2006.01)

(52) U.S. Cl. ..................................... 347/241; 347/256

(58) Field of Classification Search ................ 347/255, 347/241, 256; 359/643, 742, 845; 356/477; 355/67

See application file for complete search history.

(56) References Cited

U.S. PATENT DOCUMENTS 5,231,464 A * 7/1993 Ichimura et al. ............ 356/477
6,133,986 A 10/2000 Johnson
6,473,237 B2 10/2002 Mei
2002/0114084 A1 * 8/2002 Summersgill et al. ...... 359/742
2004/0027681 A1 * 2/2004 Sunagawa et al. .......... 359/643
2004/0156130 A1 * 8/2004 Powell et al. ............... 359/845

FOREIGN PATENT DOCUMENTS

JP 2001185792 * 7/2001

* cited by examiner

*Primary Examiner*—Hai Pham
*Assistant Examiner*—Carlos Martinez, Jr.
(74) *Attorney, Agent, or Firm*—Sughrue Mion, PLLC

(57) ABSTRACT

In an exposure head of the invention, plural first micro-focusing elements are arranged in a first microlens array so as to correspond to plural micromirrors in a DMD. An aperture array that includes plural apertures arranged so as to respectively correspond to the plural first micro-focusing elements is disposed. The apertures allow only main portions of Fraunhofer diffraction images to be transmitted therethrough. The main portions of the Fraunhofer diffraction images transmitted through the apertures are imaged on an exposure plane by second micro-focusing elements of a second microlens array. According to the exposure head of the invention, cross-talk light and scattered light can be effectively reduced, and beam diameters of beam spots projected on the exposure plane through the apertures can be adjusted to a required size.

24 Claims, 24 Drawing Sheets

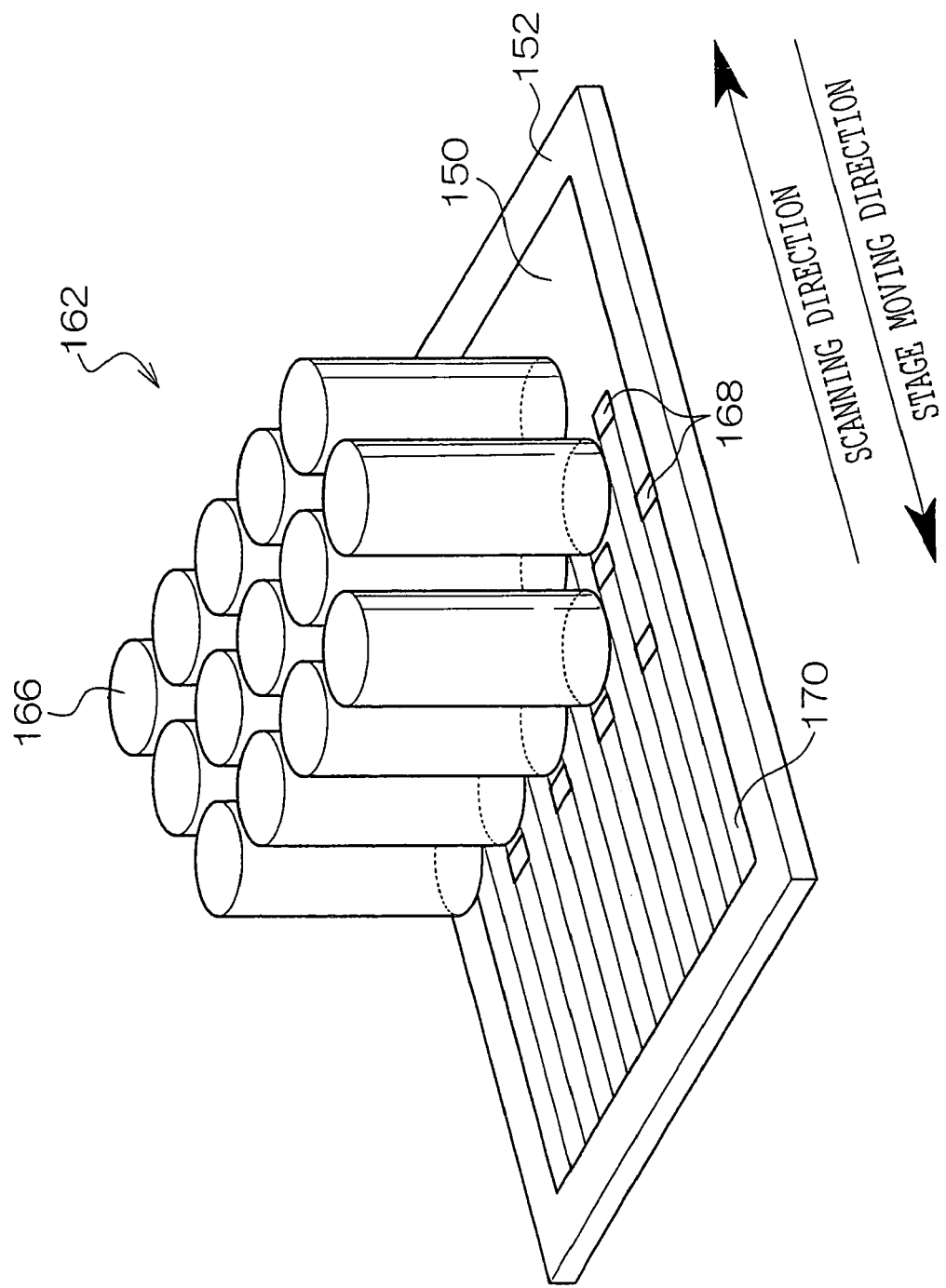

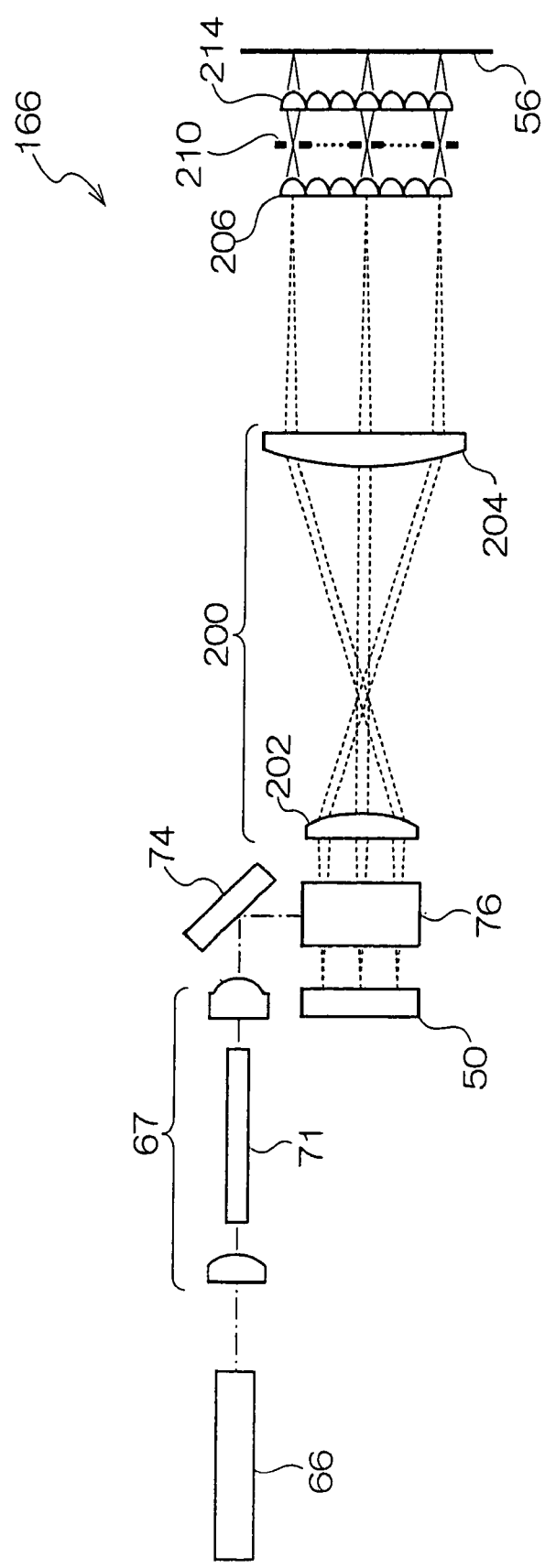

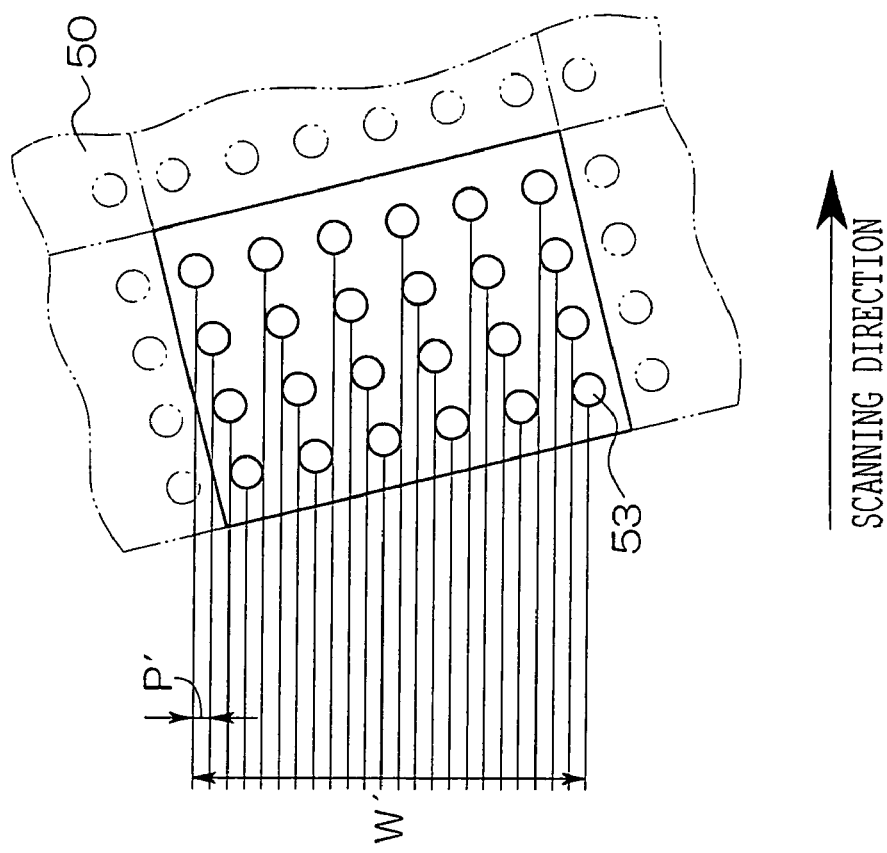
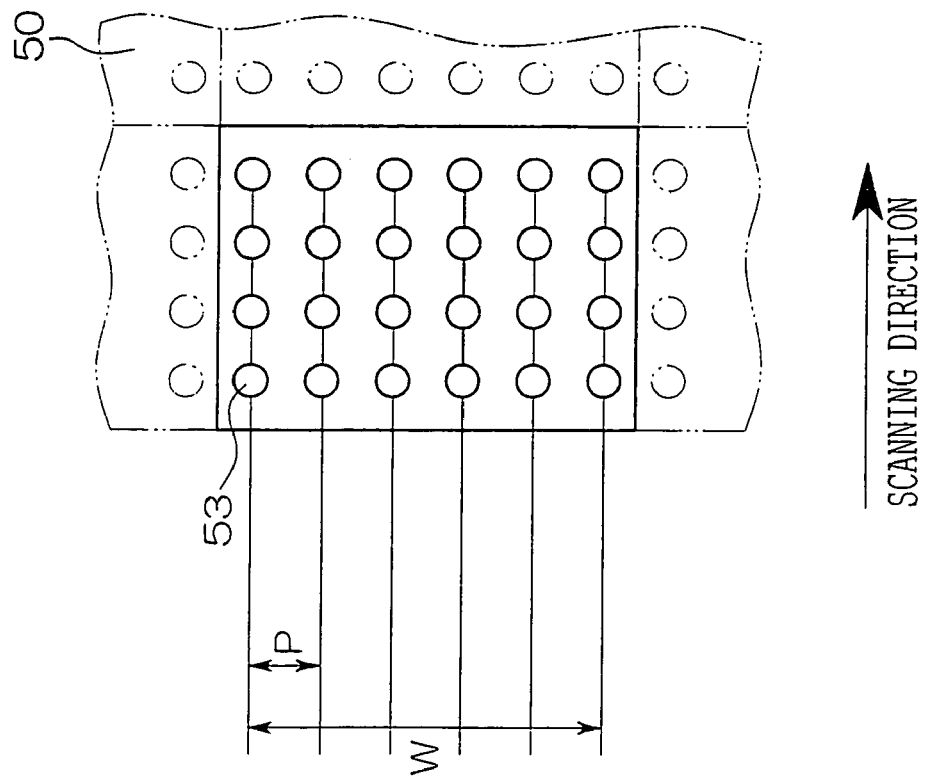

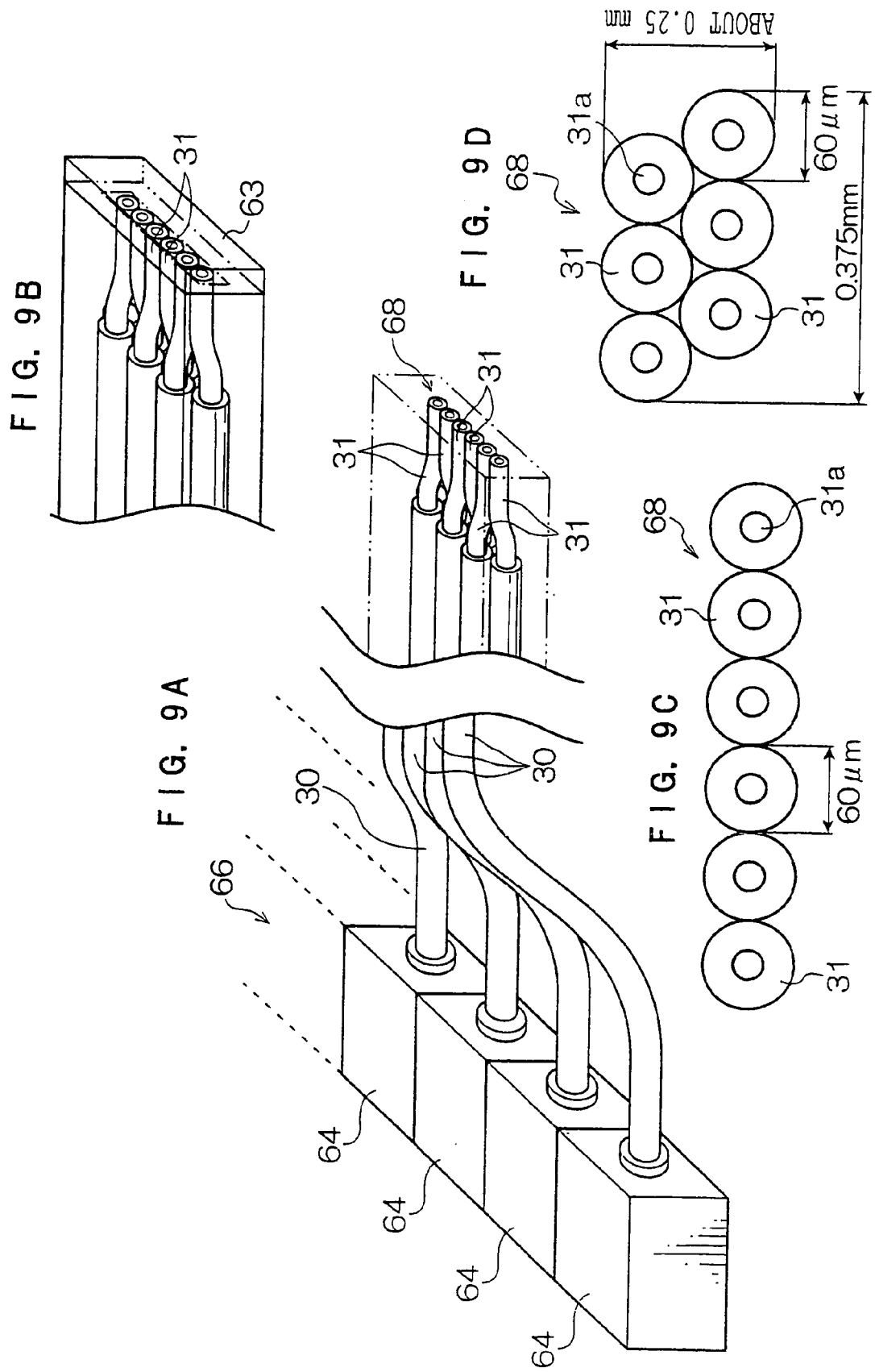

F I G. 1 4
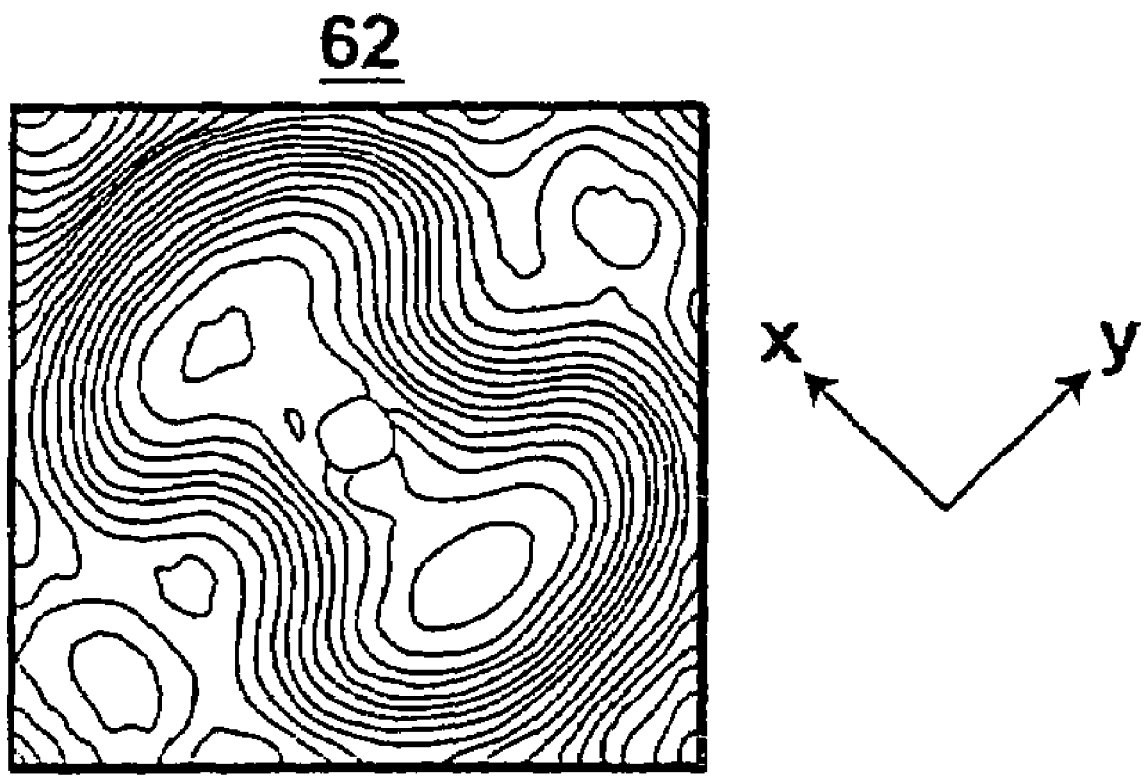

SECTION IN X-DIRECTION
(ROTATONAL DIRECTION)

SECTION IN Y-DIRECTION
(ROTATIONAL DIRECTION)

F I G. 16A  F I G. 16B
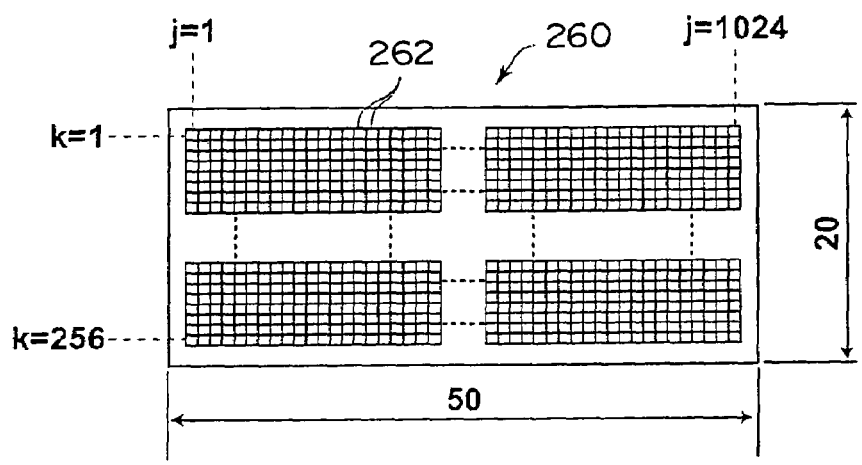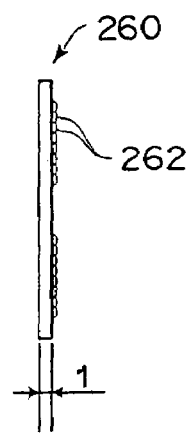
F I G. 17A  F I G. 17B
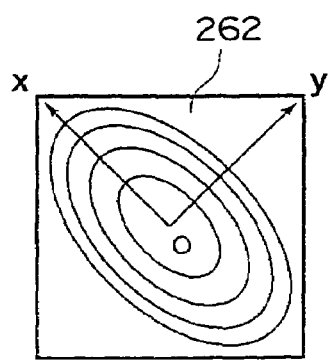

z=0.18mm z=0.2mm

F I G. 19C
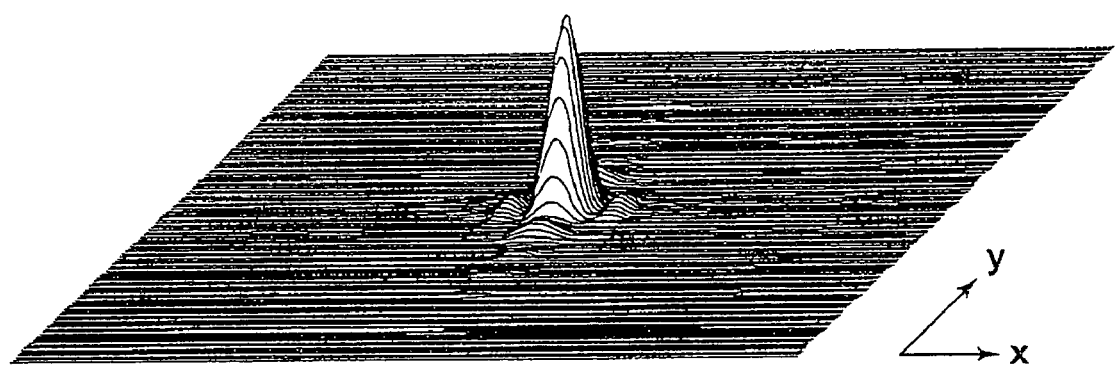
z=0.22mm
F I G. 19D
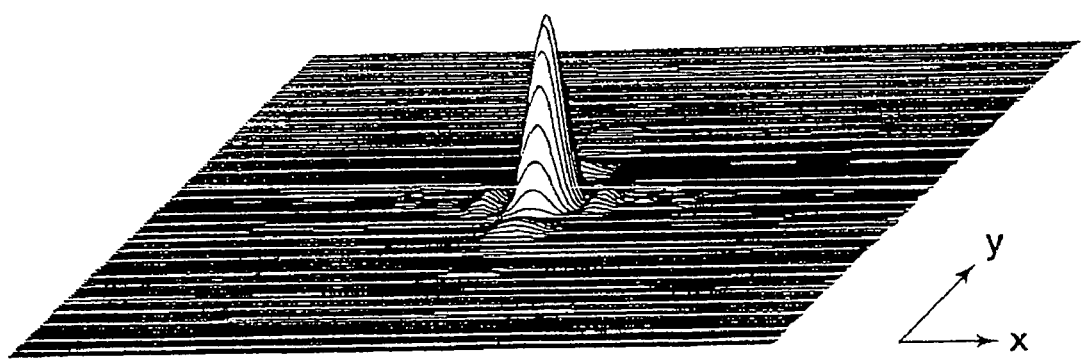
z=0.24mm z=0.18mm z=0.2mm z=0.22mm z=0.24mm FIG. 23A
FIG. 23B
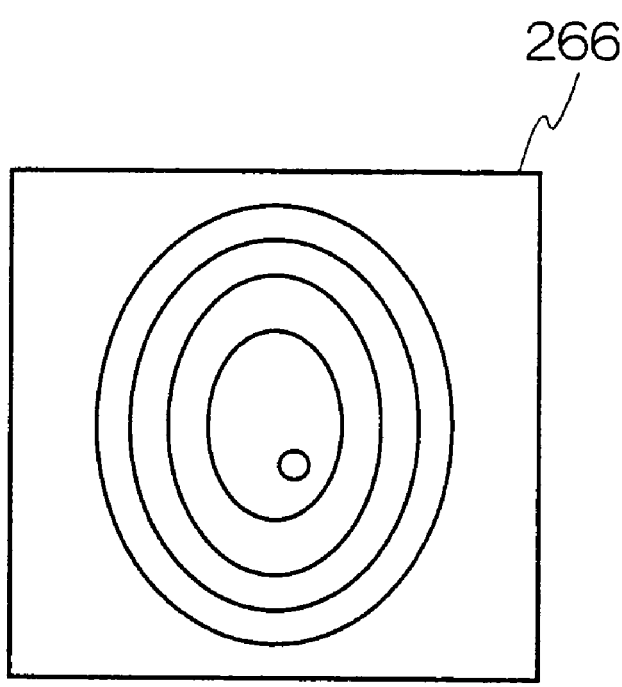
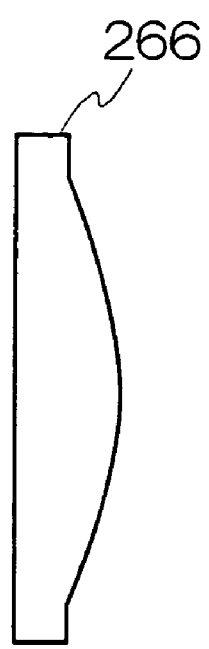

EXPOSURE HEAD WITH SPATIAL LIGHT MODULATOR

CROSS-REFERENCE TO RELATED APPLICATION

This application claims priority under 35 USC 119 from Japanese Patent Application No. 2003-204404, the disclosures of which are incorporated by reference herein.

BACKGROUND OF THE INVENTION

1. Field of the Invention

The present invention relates to an exposure head for exposing an exposure surface of a photosensitive material or the like with a bundle of light beams modulated by a spatial light modulator in correspondence to image data.

2. Description of the Related Art

Conventionally, various exposure heads for conducting image exposure with light beams modulated in correspondence to image data using a spatial light modulator such as a digital micromirror device (DMD) have been proposed.

As the DMD, a mirror device is used where numerous micromirrors, in which the angles of reflection surfaces thereof change in correspondence to control signals, are two-dimensionally arranged on a semiconductor substrate such as silicon.

The exposure head using this DMD is disposed with, for example, a light source that emits laser beams, a collimator lens system that collimates the laser beams emitted from the light source, a DMD that modulates the laser beams, and an imaging optical system that images, on an exposure plane, the laser beams reflected by the DMD.

In this exposure head, the micromirrors of the DMD are respectively controlled ON-OFF by a control device due to control signals generated in correspondence to the image data, whereby the laser beams are modulated (deflected) to an exposure state or a non-exposure state, and the exposure plane is exposed by the laser beams (the collection of these laser beams will called "beam bundle" hereinafter) modulated to the exposure state.

Here, the imaging optical system is generally configured as a magnification optical system, and the exposure area on the exposure plane is magnified with respect to the area of the effective region of the DMD in which the micromirrors are two-dimensionally arranged. However, when the area of the exposure area on the exposure plane is magnified with respect to the area of the effective region of the DMD by the imaging optical system, the area (spot diameters) of the beam spots at the exposure plane are also magnified in correspondence to the magnification (with respect to the area of the effective region of the DMD) of the area of the exposure area on the exposure plane. Thus, MTF (Modulation Transfer Function) characteristics of the exposure plane deteriorate in correspondence to the magnification of the exposure area.

With respect thereto, there are exposure heads that can solve this problem and have configurations as described in, for example, U.S. Pat. No. 6,133,986 (see FIG. 14) and U.S. Pat. No. 6,473,237 B2 (see FIG. 15).

U.S. Pat. No. 6,133,986 discloses an optical system that combines a double-telecentric projection optical system whose aperture is small but whose image field is large, an array of microlenses that respectively include large apertures and small fields, and a microlens aperture array. In a microlens scanner disposed with this optical system, a printing surface is scanned and exposed with exposure spots formed by the microlens array.

However, in this optical system, there are the problems that a trade-off is necessary between the uniformity of the illumination of the microlens apertures and the suppression of cross-talk of adjacent apertures, and it is difficult to achieve a balance between light use efficiency and obtaining uniform exposure spots at the exposure plane.

FIG. 15 of U.S. Pat. No. 6,473,237 B2 discloses a configuration that uses a group of lenses, a point array such as a microlens array, a grating and an additional group of lenses in order to image, on a subject such as a wafer, pattern information displayed on a pixel panel.

Here, the grating is one for reducing, with a blocking effect, cross-talk light and noise light resulting from the diffraction component of the light illuminating the pixel panel and diffraction and scattering from the pixel panel.

However, when the grating is disposed at a position before the position where the focused light beam resulting from the microlens array is focused, i.e., in the region of so-called Fresnel diffraction, the effect of reducing cross-talk light and scattered light is not sufficient. Also, when the grating is disposed at the focal position of the focused light beams, i.e., the position of so-called Fraunhofer diffraction, the subject cannot be directly placed at the beam focal position because a working distance cannot be secured, and it becomes necessary to image the light on the subject via the additional lens group (imaging lens system).

This imaging lens system has drawbacks in that numerous element lenses become necessary particularly when conducting high-resolution imaging, costs increase, and the imaging lens system requires a large space.

SUMMARY OF THE INVENTION

In consideration of the above-described facts, the present invention provides an exposure head that enables, optical pattern information displayed by a spatial light modulator, to be exposed with high resolving power and high resolution across a wide exposure area.

In the invention, an exposure head that relatively moves along a scanning direction with respect to an exposure plane and is for two-dimensionally exposing the exposure plane with a bundle of light beams arranged along a row direction orthogonal to the scanning direction includes: a spatial light modulator where plural pixel portions whose light modulation states respectively change in correspondence to control signals are one-dimensionally or two-dimensionally arranged, which spatial light modulator divides light beams made incident thereon from a light source portion into plural pixel beams using the plural pixel portions, and selectively modulates the respective plural pixel beams into one of an exposure state and a non-exposure state; a first micro-focusing element array where plural first micro-focusing elements are arranged so as to correspond to the plural pixel portions of the spatial light modulator; an aperture array that is disposed in the vicinity of a rear-side focal plane of the first micro-focusing elements at which the first micro-focusing elements form Fraunhofer diffraction images of the pixels beams modulated to the exposure state by the spatial light modulator, and in which aperture array plural apertures that respectively correspond to the plural first micro-focusing elements are arranged, and which aperture array allows only main portions of the Fraunhofer diffraction images to be transmitted through the apertures; and a second micro-focusing element array that includes plural second micro-focusing elements arranged so as to correspond to the plural apertures and which array forms, on the exposure plane, real images of the pixel beams respectively transmitted through the plural apertures by using the plural second micro-focusing elements.

In the exposure head pertaining to the invention, the plural first micro-focusing elements are arranged in the first micro-focusing element array so as to correspond to the plural pixel portions in the spatial light modulator. Also, the aperture array disposed in the vicinity of the rear-side focal plane of the first micro-focusing elements includes the plural apertures arranged so as to respectively correspond to the plural first micro-focusing elements.

Only the main portions of the Fraunhofer diffraction images formed by the first microlens array are allowed to be transmitted through the apertures, whereby beam diameters of the pixel beams modulated to the exposure state by the pixel portions of the spatial light modulator can be reduced. Thus, a first excellent effect is obtained in that the beam diameters of the beam spots projected on the exposure plane through the second microlens array can be adjusted to a required size.

Also, in the exposure head pertaining to the invention, real images of the pixel beams respectively transmitted through the plural apertures are formed on the exposure plane by the plural second micro-focusing elements. Thus, the pixel beams whose beam diameters have been reduced by being transmitted through the first micro-focusing elements of the first micro-focusing element array (and the apertures of the aperture array) can be imaged as beam spots at positions determined by the focal distance and imaging magnification of the second micro-focusing elements.

Thus, a second excellent effect is obtained in which cross-talk light and scattered light is effectively reduced by the action of the apertures, a required working distance is secured and the exposure plane can be directly set at the focal position of the pixel beams.

In the prior art, a micro-focusing element array such as a microlens array has been used in order to secure working distance. In other words, it has been necessary to use an imaging lens system comprising plural element lenses.

In contrast, in the present invention, the number of parts of the device can be significantly reduced because such plural element lenses are unnecessary. Thus, the space in which the device is disposed can be significantly reduced, and a reduction in device production costs and miniaturization of the device become possible.

In the exposure head pertaining to the invention described above, aspherical lenses such as toric lenses can be used as at least one of the first micro-focusing elements and the second micro-focusing elements.

BRIEF DESCRIPTION OF THE DRAWINGS

FIG. 2 is a perspective view showing the configuration of a scanner of the exposure device shown in FIG. 1;

FIG. 4 is a side view showing the schematic configuration of the exposure head pertaining to the embodiment of the invention;

FIG. 8A is a plan view showing the disposition and scanning lines of exposure beams in a case where the DMD is not disposed at an inclination, and FIG. 8B is a plan view showing the disposition and scanning lines of exposure beams in a case where the DMD is disposed at an inclination;

FIG. 9A is a perspective view showing the configuration of a fiber array light source, FIG. 9B is a partially enlarged view of FIG. 9A, FIG. 9C is a plan view showing the arrangement of light-emitting points in a laser emission portion and FIG. 9D is another plan view showing the arrangement of the light-emitting points in the laser emission portion;

FIG. 14 is a plan view where results, obtained when the flatness of the reflection surfaces of the micromirrors configuring the DMD is measured, are shown with contour lines;

FIGS. 16A and 16B are a front view and a side view showing the configuration of a microlens array using toric lenses;

FIGS. 17A and 17B are a front view and a side view showing the configuration of a toric lens in the microlens array shown in FIGS. 16A and 16B;

FIG. 19C is a graph showing simulation results of a beam diameter in the vicinity of the condensing position in a case where toric lenses are used as the microlenses of the microlens array, and shows a case where the distance from the beam-emitting surfaces of the microlenses to the evaluation position is 0.22 mm;

FIG. 19D is a graph showing simulation results of a beam diameter in the vicinity of the condensing position in a case where toric lenses are used as the microlenses of the microlens array, and shows a case where the distance from the beam-emitting surfaces of the microlenses to the evaluation position is 0.24 mm;

FIGS. 23A and 23B are a front view and a side view showing the configuration of a modified example of the toric lens shown in FIGS. 17A and 17B.

DETAILED DESCRIPTION OF THE INVENTION

An embodiment of the invention will be described in detail below with reference to the drawings.

(Configuration of Exposure Device)

Figure 1:
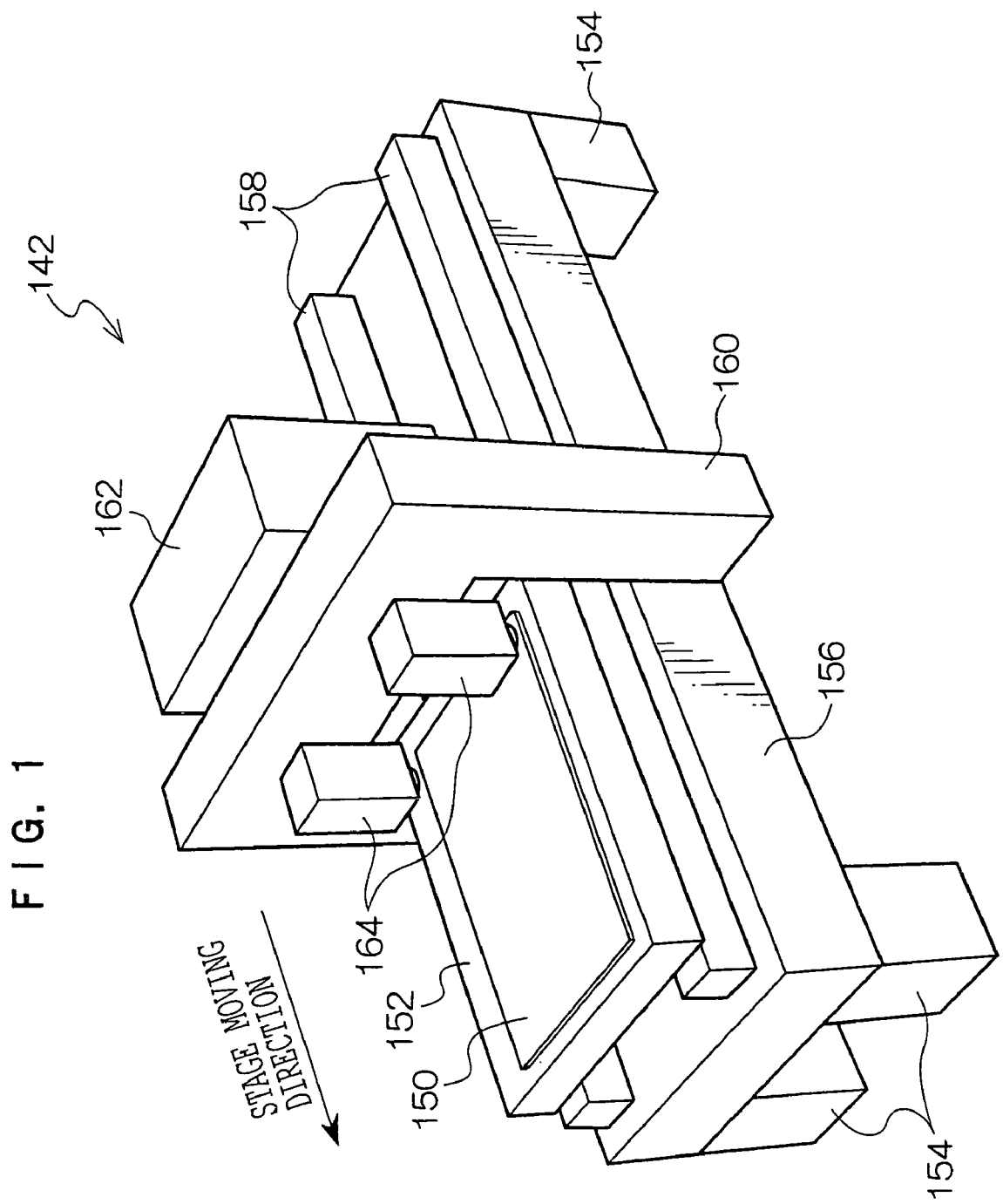
FIG. 1 is a perspective view showing the exterior of an exposure device to which an exposure head pertaining to an embodiment of the invention has been applied.

As shown in FIG. 1, an exposure device 142 to which an exposure head pertaining to the embodiment of the invention has been applied is disposed with a planar stage 152 that includes a surface to which a sheet-like photosensitive material 150 is carried and retained. Two guides 158 that extend along the stage moving direction are disposed on an upper surface of a thick planar mount 156 supported by leg portions 154. The stage 152 is supported by the guides 158 so as to be capable of reciprocal movement. It should be noted that an unillustrated drive device for driving the stage 152 along the guides 158 is disposed in the exposure device 142.

A substantially U-shaped gate 160 is disposed at a central portion of the mount 156 so as to straddle the movement path of the stage 152. End portions of the gate 160 are fixed to both side surfaces of the mount 156. A laser scanner 162 is disposed at one side of the gate 160, and plural (e.g., two) detection sensors 164 that detect the leading end and trailing end of the photosensitive material 150 are disposed at the other side of the gate 160, so that the gate 160 is disposed between the laser scanner 162 and the detection sensors 164. The laser scanner 162 and the detection sensors 164 are respectively attached to the gate 160 and fixedly disposed above the movement path of the stage 152. It should be noted that the laser scanner 162 and the detection sensors 164 are connected to an unillustrated controller that controls them.

Figure 3A:
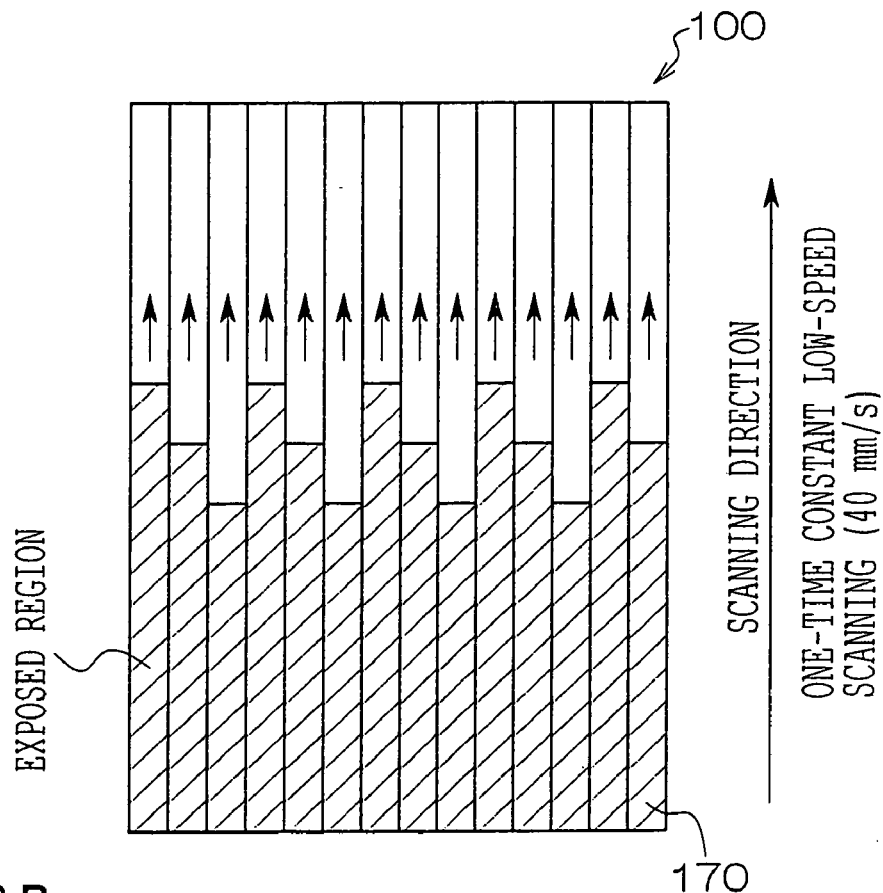
FIG. 3A is a plan view showing an exposed region formed on a photosensitive material.
Figure 3B:
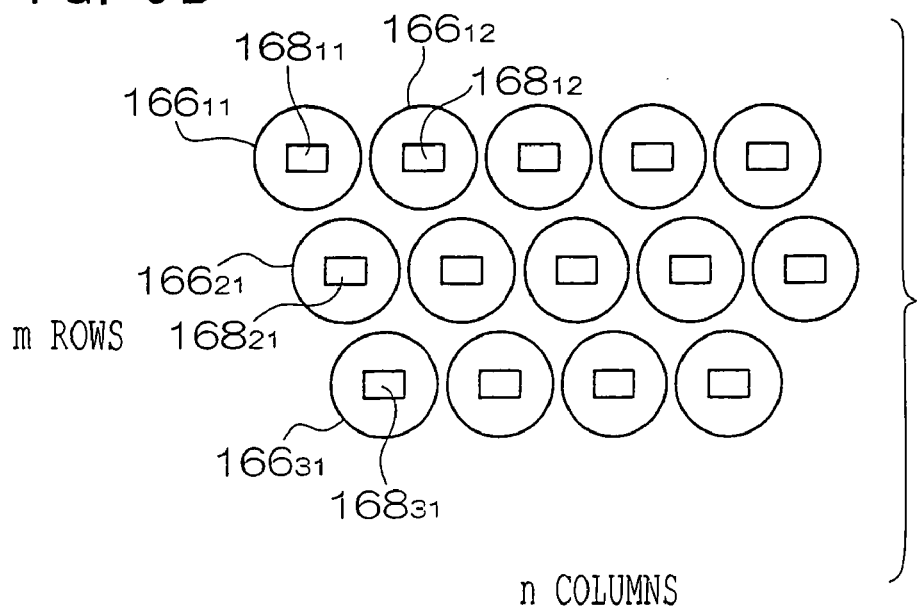
FIG. 3B is a view showing the arrangement of exposure areas resulting from exposure heads.

As shown in FIG. 2 and FIG. 3B, the laser scanner 162 is disposed with plural (e.g., fourteen) exposure heads 166 arranged in a substantial matrix of m rows and n columns (e.g., three rows and five columns). In this example, four exposure heads 166 are in the third row due to the relation with the width of the photosensitive material 150. It should be noted that, when indicating an individual exposure head arranged in m-th row and n-th column, that particular exposure head will be indicated as "exposure head $166_{mn}$".

Exposure areas 168 resulting from the exposure heads 166 are rectangular shapes where the short edges are parallel to the scanning direction. Thus, a band-like exposed region 170 is formed per exposure head 166 on the photosensitive material 150 in accompaniment with the movement of the stage 152. It should be noted that, when indicating an exposure area resulting from an exposure head arranged in m-th row and n-th column, that particular exposure area will be indicated as "exposure area $168_{mn}$".

Also, as shown in FIGS. 3A and 3B, the exposure heads in the linearly arranged rows are disposed offset by a predetermined distance (several times the natural number of the long edges of the exposure areas; in the present embodiment, twice) in the arrangement direction so that the band-like exposed regions 170 are lined up without gap in the direction orthogonal to the scanning direction. For this reason, the portion that cannot be exposed between exposure area $168_{11}$ and exposure area $168_{12}$ in the first row can be exposed by exposure area $168_{21}$ in the second row and exposure area $168_{31}$ in the third row.

As shown in FIG. 4, each exposure head $166_{11}$ to $166_{mn}$ is disposed with a digital micromirror device (DMD) 50 as a spatial light modulator that modulates, per pixel, incident light beams in correspondence to image data.

The DMD 50 is connected to an unillustrated controller disposed with a data processor and a mirror drive controller. The data processor of the controller generates control signals that controllably drive the micromirrors in the region to be controlled (effective region) of the DMD 50, per exposure head 166, on the basis of inputted image data. The effective region of the DMD 50 will be described later.

The mirror drive controller controls the angles of reflection surfaces of the micromirrors of the DMD 50 per exposure head 166 on the basis of the control signals generated by the image data processor. The control of the angles of the reflection surfaces will also be described later.

As shown in FIG. 4, provided in the following order in the exposure head 166 are a fiber array light source 66 disposed with a laser emission portion where emission end portions (light-emitting points) of optical fibers are arranged in one row along a direction corresponding to the long edge direction of the exposure areas 168, an illumination optical system 67 that irradiates laser beams emitted from the fiber array light source 66 as uniform illumination light onto the DMD 50, a reverse mirror 74 that reflects laser beams transmitted through the illumination optical system 67 towards the DMD 50, and a TIR (Total Internal Reflectance)

prism 76 that separates with high efficiency the laser beams reflected by the reverse mirror 74 and made incident at the DMD 50 and the laser beams reflected by the DMD 50.

Here, a microrod lens 71 is disposed as an element lens at an intermediate portion along the optical axis direction in the illumination optical system 67. The illumination light is made uniform by the laser beams from the fiber array light source 66 being transmitted through the microrod lens 71.

Figure 6:
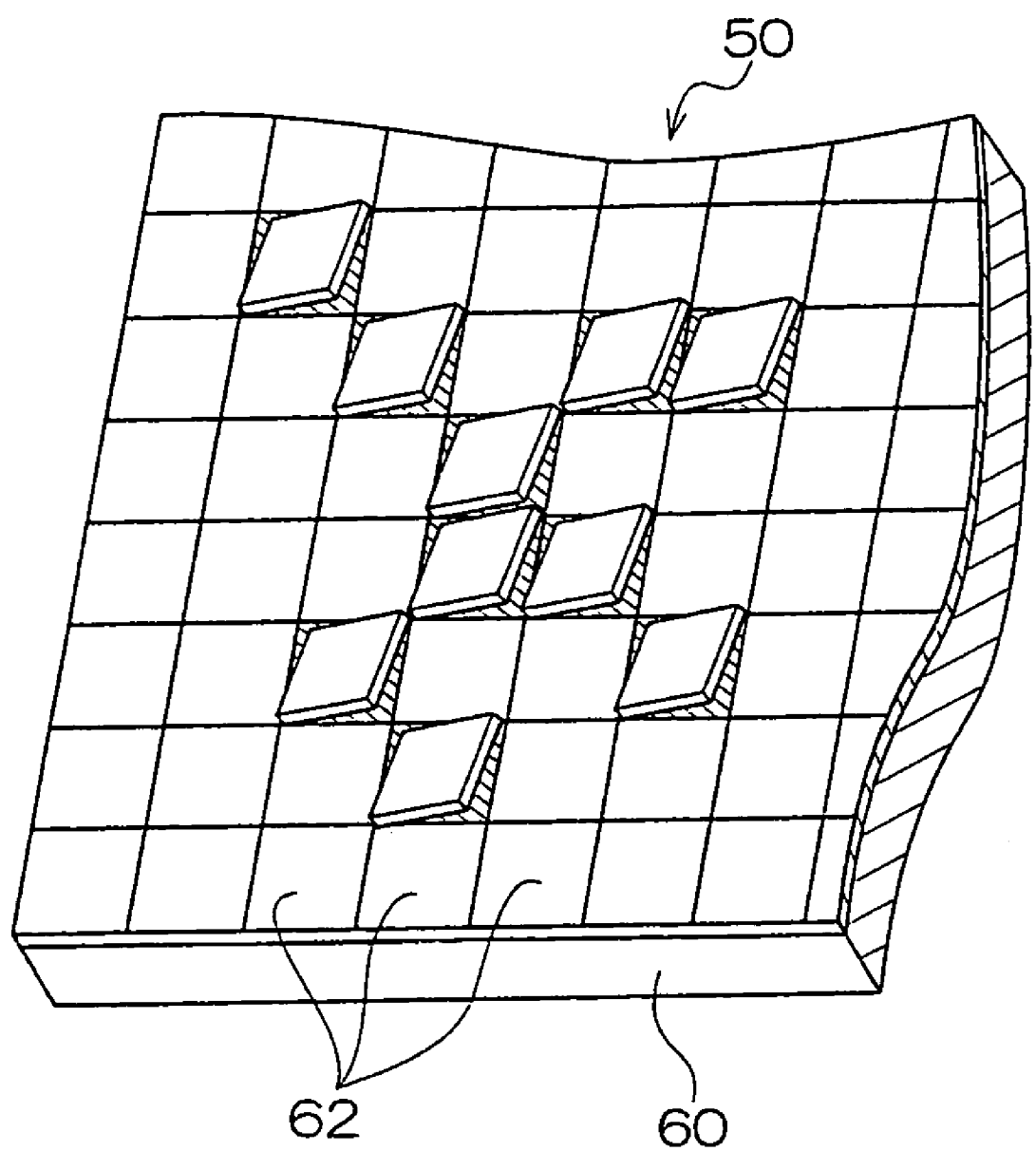
FIG. 6 is a partially enlarged view showing the configuration of a the DMD.

As shown in FIG. 6, the DMD 50 is one where micromirrors 62 are supported by supports and disposed on a SRAM cell (memory cell) 60. The DMD 50 is a mirror device configured by numerous (e.g., 600×800) micromirrors configuring pixels that are arranged in a grid. The micromirrors 62 supported by supports are disposed at the uppermost portion of each pixel, and a material having a high reflectivity, such as aluminium, is deposited on the surfaces of the micromirrors 62. The reflectivity of the micromirrors 62 is 90% or higher.

Also, disposed directly below the micromirrors 62 is the SRAM cell 60 of a CMOS silicon gate produced in a production line of common semiconductor memories via the supports including a hinge and a yoke. Overall, it is configured monolithically.

Figure 7A:
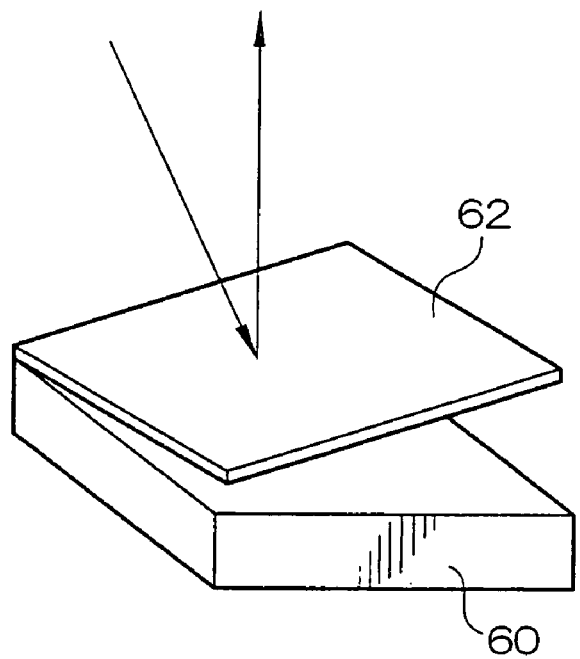
FIG. 7A is an explanatory view for describing the operation of the DMD.
Figure 7B:
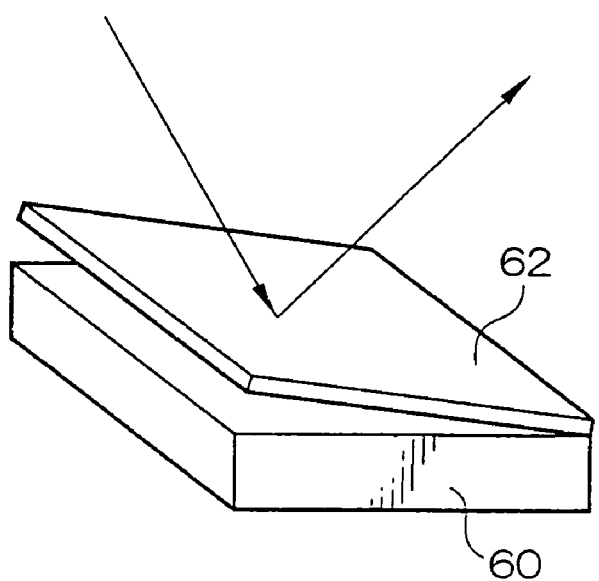
FIG. 7B is another explanatory view for describing the operation of the DMD.

When a digital signal is written to the SRAM cell 60 of the DMD 50, the micromirrors 62 supported by the supports are slanted around a diagonal line thereof in a range of $\pm\alpha$ degrees (e.g., $\pm 10$ degrees) with respect to the side of a substrate at which the DMD 50 is disposed. FIG. 7A shows a state where a micromirror 62 is slanted at $+\alpha$ degrees, which is an ON state, and FIG. 7B shows a state where a micromirror 62 is slanted at $-\alpha$ degrees, which is an OFF state.

Thus, by controlling the inclination of the micromirrors 62 of the pixels of the DMD 50 in correspondence to an image signal as shown in FIG. 6, the light made incident at the DMD 50 is reflected in directions corresponding to the respective inclinations of the micromirrors 62.

It should be noted that FIG. 6 shows an example where a portion of the DMD 50 is shown in an enlarged state, the micromirrors 62 of which portion of the DMD are controlled to have inclinations of $+\alpha$ degrees or $-\alpha$ degrees. The ON-OFF control of the micromirrors 62 is conducted by the unillustrated controller connected to the DMD 50.

Here, the light reflected by the micromirrors 62 in the ON state is modulated to the exposure state and made incident at the illumination optical system 67 (see FIG. 4) disposed at the light-emitting side of the DMD 50. Also, the light reflected by the micromirrors 62 in the OFF state is modulated to the non-exposure state and made incident at a light absorber (not shown).

Also, it is preferable for the DMD 50 to be disposed so that the short edge direction (row direction) thereof is slightly slanted so as to form a predetermined angle θ (e.g., 0.1° to 0.5°) with the scanning direction.

FIG. 8A shows the scanning loci of beam spots (laser beams) 53 on the exposure plane resulting from the micromirrors in which the DMD 50 is not slanted, and FIG. 8B shows the scanning loci of the beam spots 53 on the exposure plane resulting from the micromirrors in which the DMD 50 is slanted.

In the DMD 50, numerous (e.g., 600) micromirror rows, in each of which numerous (e.g., 800) micromirrors are arranged along the longitudinal direction of the DMD, are arranged in the short direction of the DMD.

As shown in FIG. 8B, by slanting the DMD 50, the pitch P' of the scanning loci (scanning lines) of the exposure beams 53 resulting from the micromirrors becomes narrower than the pitch P of the scanning lines in the case where the DMD 50 is not slanted, whereby the resolution can be significantly improved. In this structure, because the inclination angle of the DMD 50 is extremely small, the scanning width W' in the case where the DMD 50 is slanted can be regarded as being substantial identical to the scanning width W in the case where the DMD 50 is not slanted.

It should be noted that, instead of slanting the DMD 50, the same effect as described above can be obtained when the micromirror rows are disposed in a staggered manner so that they are offset by predetermined intervals in the direction orthogonal to the scanning direction.

As shown in FIG. 9A, the fiber array light source 66 is disposed with plural (e.g., six) laser modules 64, and ends of multimode optical fibers 30 are coupled to the laser modules 64. Coupled to the other ends of the multimode optical fibers 30 are optical fibers 31 whose core diameter is the same as that of the multimode optical fibers 30 and whose clad diameter is smaller than that of the multimode optical fibers 30. As shown in FIG. 9C, emission end portions (light-emitting points) of the optical fibers 31 are arranged in one row along the direction orthogonal to the scanning direction to configure a laser emission portion 68.

It should be noted that, as shown in FIG. 9D, the light-emitting points can also be arranged in two rows along the direction orthogonal to the scanning direction.

The emission end portions (see FIGS. 9A to 9D) of the optical fibers 31 are sandwiched and fixed between two support plates (not shown) whose surfaces are flat. Also, as shown in FIG. 9B, a transparent protection plate 63, such as glass, is disposed at the light-emitting side of the optical fibers 31 in order to protect the end surfaces of the optical fibers 31. The emission end portions of the optical fibers 31 tend to deteriorate relatively quickly because their optical density is high and they easily collect dust; however, by disposing the protection plate 63, dust can be prevented from adhering to the end surfaces and deterioration can be delayed.

The multimode optical fibers 30 and the optical fibers 31 may be any of step-index optical fibers, graded-index optical fibers and complex optical fibers. For example, the step-index optical fibers manufactured by Mitsubishi Cable Industries, Ltd. can be used.

In the present embodiment, the multimode optical fibers 30 and the optical fibers 31 are step-index optical fibers. With respect to the multimode optical fibers 30, the clad diameter is 125 μm, the core diameter is 25 μm, the NA is 0.2 and the transmittance of the incident-end surface coat is 99.5% or higher, and with respect to the optical fibers 31, the clad diameter is 60 μm, the core diameter is 25 μm and the NA is 0.2.

Figure 10:
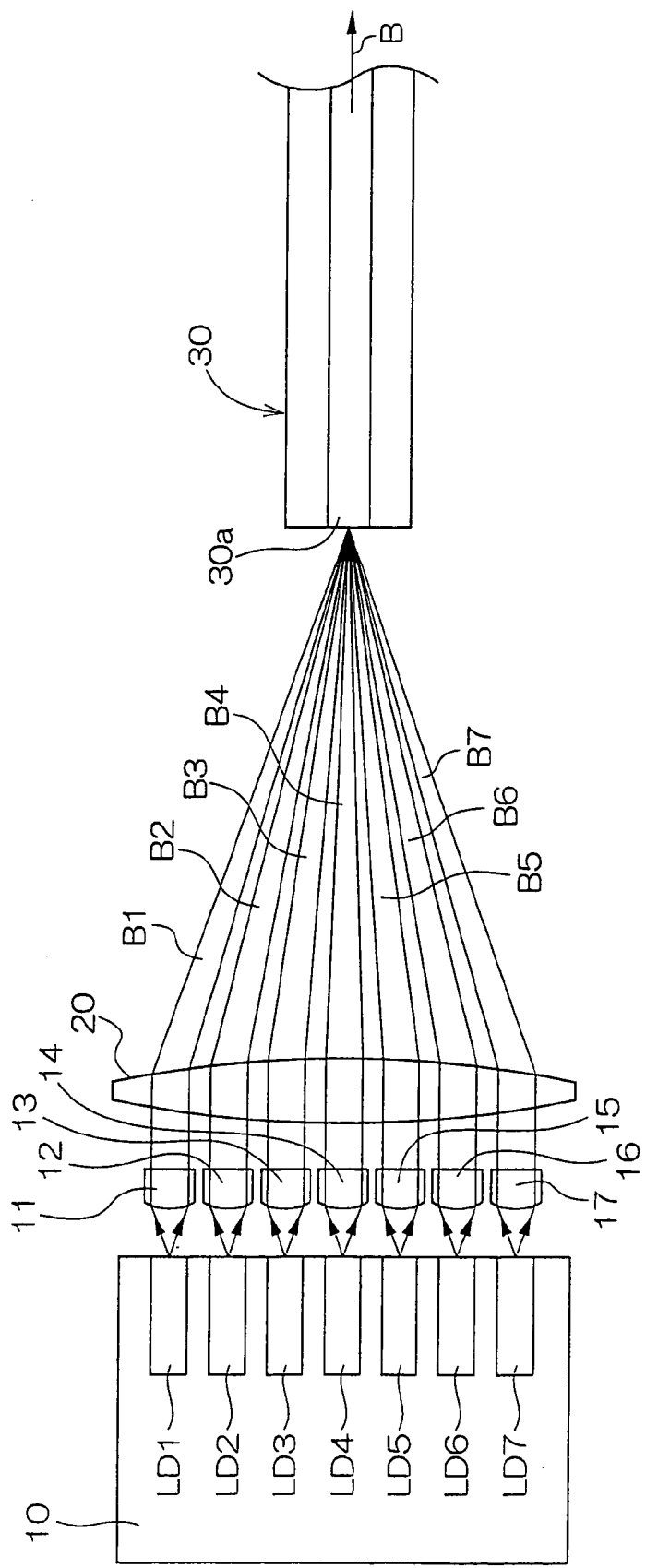
FIG. 10 is a side view showing the configuration of a multiplex laser beam source.

The laser modules 64 are configured by the multiplex laser beam source (fiber light source) shown in FIG. 10. The multiplex laser light source is configured by plural (e.g., seven) chip-like horizontal multimode or single-mode GaN semiconductor lasers LD1, LD2, LD3, LD4, LD5, LD6 and LD 7 that are arranged and fixed on a heat block 10, collimator lenses 11, 12, 13, 14, 15, 16 and 17 that are disposed in correspondence to the GaN semiconductor lasers LD1 to LD7, one condenser lens 20, and one multimode optical fiber 30. It should be noted that the number of the semiconductor lasers is not limited to seven.

Next, the configuration of the optical system at the light-reflecting side of the DMD 50 in the exposure head 166 will be described.

Figure 5:
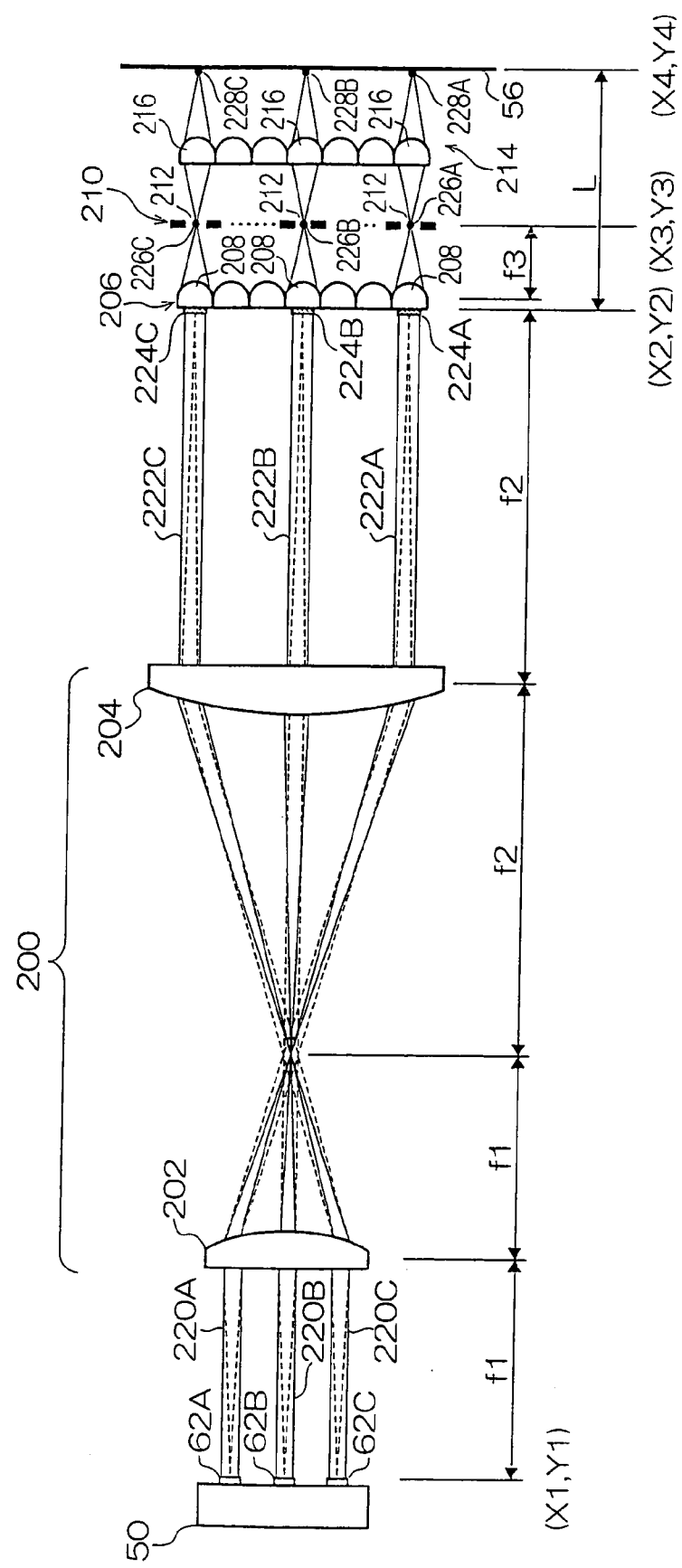
FIG. 5 is a side view showing the configuration of an optical system disposed at the light-reflecting side of a digital micromirror device (DMD) in the exposure head shown in FIG. 4.

As shown in FIG. 5, an imaging lens system 200, a first microlens array 206, an aperture array 210 and a second microlens array 214 are disposed in order along the traveling direction of the pixel beams at the light-reflecting side of the DMD 50 in the exposure head 166. Here, the DMD 50 is disposed on a plane (X1, Y1), and the micromirrors 62 of the DMD 50 are disposed along the plane (X1, Y1).

Also, the imaging lens system 200 is preferably a telecentric optical system at both the incident side (object side) and the emission side (image side) of the pixel beams, and focal distances of element lenses 202 and 204 of the imaging lens system 200 are f1 and f2, respectively.

In FIG. 5, 220A, 220B and 220C are pixel beams respectively modulated to the exposure state by micromirrors 62A, 62B and 62C; 222A, 222B and 222C are pixel beams respectively transmitted through the imaging lens system 200; and 224A, 224B and 224C are real images of the micromirrors 62A, 62B and 62C respectively formed by the imaging lens system 200.

It should be noted that although only two element lenses 202 and 204, which are disposed at both ends of the imaging lens system 200 in the optical axis direction, are shown in FIG. 5, in actuality it is common for the imaging lens system 200 to be configured by numerous element lenses, such as five to fifteen, or by plural element lenses including aspherical lenses, whose production is difficult, in order to conduct imaging of a sufficiently high resolution.

The imaging lens system 200 images the micromirrors 62 configuring the DMD 50 (in FIG. 5, only three micromirrors 62A, 62B and 62C are shown) on the incident planes of the first microlens array 206. Namely, the reflection surfaces of the micromirrors 62A, 62B and 62C and the incident planes of the first microlens array 206 on which the real images 224A, 224B and 224C are formed are in a mutually conjugate relation in relation to the imaging lens system 200.

In FIG. 5, the pixel beams 220A, 220B and 220C modulated to the exposure state by the micromirrors 62A, 62B and 62C of the DMD 50 are represented by solid lines, and their conjugate relations relating to the imaging lens system 200 are represented by dotted lines.

For simplification of description, only the three micromirrors 62A, 62B and 62C are shown in FIG. 5, but in the exposure head 166, a required effective region is selected from the light-reflecting surfaces configured by all (e.g., 800×600, 1024×256) of the micromirrors 62 of the DMD 50, and the laser beams are modulated by numerous (e.g., 200×600) micromirrors 62 included in this effective region.

Plural microlenses 208 are disposed in the first microlens array 206, and these microlenses 208 are disposed so that the light-incident planes thereof match the plane (X2, Y2) on which the real images 224A, 224B and 224C of the micromirrors 62A, 62B and 62C are formed.

Also, the microlenses 208 of the first microlens array 206 correspond, on a 1:1 basis, to the plural micromirrors 62 arranged in the effective region of the DMD 50. Namely, for example, in a case where laser beams are modulated using 800×600 micromirrors 62 in the DMD 50, 800×600 microlenses 208 are two-dimensionally arranged in the first microlens array 206 to respectively correspond to the micromirrors 62.

Here, the focal distance of the microlenses 208 of the first microlens array 206 is f3, and 226A, 226B and 226C respectively represent pixel beams (Fraunhofer diffraction images) focused by the microlenses 208 of the first microlens array 206.

Namely, the laser beams modulated by the DMD 50 are generally emitted as the substantially collimated pixel beams 220A, 220B and 220C, pass through the imaging lens system 200 and are made incident at the microlenses 208 of the first microlens array 206 as substantially collimated pixel beams 222A, 222B and 222C.

These pixel beams 222A, 222B and 222C are respectively focused by the microlenses 208 of the first microlens array 206 to form Fraunhofer diffraction images on a focal plane (X3, Y3) of the first microlens array 206.

As shown in FIG. 5, the aperture array 210 is disposed on the focal plane (X3, Y3) of the first microlens array 206. Apertures 212 are two-dimensionally arranged in the aperture array 210 so as to correspond, on a 1:1 basis, to the microlenses 208 of the first microlens array 206. These apertures 212 have a size and shape that allow substantially only 0-order diffraction images of the Fraunhofer diffraction images formed by the microlenses 208 of the first microlens array 206 to be transmitted therethrough.

Thus, the noise components included in the diffraction images formed by the first microlens array 206, e.g., the scattering components included in the laser beams illuminating the DMD 50 and the scattering components generated from the DMD 50, or the cross-talk components that arise due to diffraction from the DMD 50 are blocked.

The pixel beams that have passed through the aperture array 210 and whose noise components have been removed are imaged by microlenses 216 of the second microlens array 214 to form exposure spots 228A, 228B and 228C on an exposure plane 56.

At this time, because a constant space (working distance) is secured between the second microlens array 214 and the exposure plane 56, the photosensitive material disposed on the exposure plane 56 can be exposed by the high-resolution exposure spots 228A, 228B and 228C.

Also, because the focal distances of the microlenses 208 and 216 of the first and second microlens arrays 206 and 214 can ordinarily be set to about 0.1 to 1 mm, the distance L from the plane on which the real images 224A, 224B and 224C of the micromirrors 62 of the DMD 50 are formed to the exposure plane 56 can be set to 10 mm or less.

Next, theoretical description will be given of the resolving power obtained by the optical system comprising the DMD 50, the first microlens array 206, the aperture array 210 and the second microlens array 214 configured as described above.

Figure 11A:
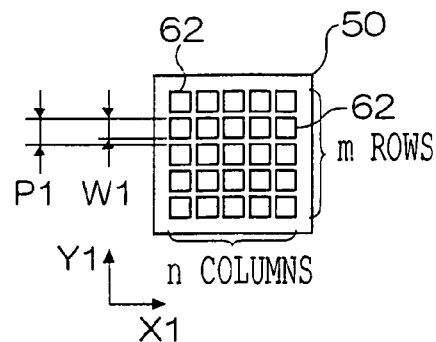
FIGS. 11A to 11D are plan views showing the relation between the sizes and pitches of exposure beams at planes (X1, Y1), (X2, Y2), (X3, Y3) and (X4, Y4) shown in FIG. 5.

FIG. 11A shows the DMD 50 disposed on the conjugate plane (X1, Y1) shown in FIG. 5. However, here, only a part of the micromirrors 62 (5 rows×5 columns) in the DMD 50 are shown. Typically, the micromirrors 62 are arranged in the DMD 50 in 600 rows×800 columns. Here, P1 represents the pixel period and W1 represents the pixel size, with the pixel size W1 being the same size in the row direction (X1 direction) and in the column direction (Y1 direction).

Figure 11B:
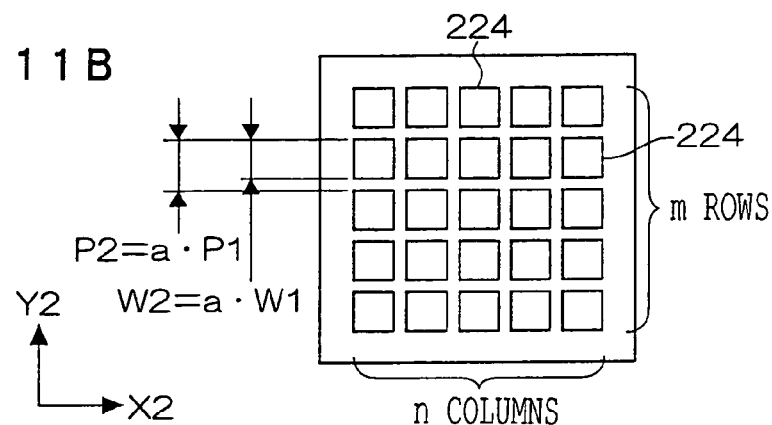

FIG. 11B shows the real images 224 of the micromirrors 62 formed on the conjugate plane (X2, Y2). Here, the imaging magnification of the imaging lens system 200 is calculated by f2/f1, the pixel period P2 of the real images 224 is calculated by a·P1, and the image size W2 is calculated by a·W1.

Figure 11C:
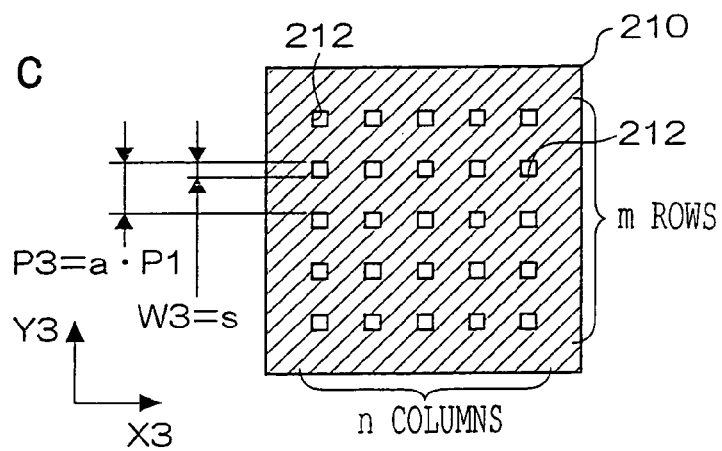

FIG. 11C shows the aperture array 210 disposed on the focal plane (X3, Y3). As mentioned before, the Fraunhofer diffraction images of the pixel beams 222A, 222B and 222C made incident at the microlenses 208 of the first microlens array 206 are formed on the focal plane (X3, Y3).

Here, assuming that the effective apertures of the microlenses 208 of the first microlens array 206 appropriately correspond to the incident pixel beams 222A, 222B and 222C, the diffraction images formed on the focal plane (X3, Y3) can be regarded as diffraction images in a case where rectangular apertures that are of the same size as the size of the pixel beams 222A, 222B and 222C are uniformly illuminated.

In this case, the intensity distribution I (X3, Y3) when the origins of the coordinates are at the center of each pixel is expressed by the following equation (7) assuming that the focal distance of each microlens 208 of the first microlens array 206 is f3.

$$I(X_3, Y_3) = C \cdot \text{sinc}^2(W2 \cdot X3/\lambda \cdot f3) \cdot \text{sinc}^2(W2 \cdot Y3/\lambda \cdot f3) \quad (7)$$

In the equation, C is a constant and $\text{sinc}^2(\omega) = \sin(\pi\omega)/(\pi\omega)$.

The above intensity distribution I (X3, Y3) has a principal maximum (0-order diffraction image) at the center ($\omega=0$) and becomes 0 at $\omega=1, 2, 3, \ldots$. A sub-maximum appears between $\omega=1, 2, 3, \ldots$, but the intensity is far lower in comparison to the principal maximum, and the greater portion of the total energy is included in the 0-order diffraction images.

Also, the coordinates $(X3_1, Y3_1)$ where $\omega=1$, providing the peripheral edge of the 0-order diffraction image, are $|X3_1|=|Y3_1|=\lambda \cdot f3/W2$. Here, when the aperture array 210 including the square apertures 212 of $s=2 \cdot |X3_1|=2 \cdot |Y3_1|=2\lambda \cdot f3/W2$ is disposed in the X direction and the Y direction at the position of each pixel and only the 0-order diffraction images are allowed to be transmitted, the pixel period becomes $P3=P2=a \cdot P1$ and the pixel size becomes $W3=s$ immediately after the 0-order diffraction images are transmitted through the aperture array 210.

Figure 11D:
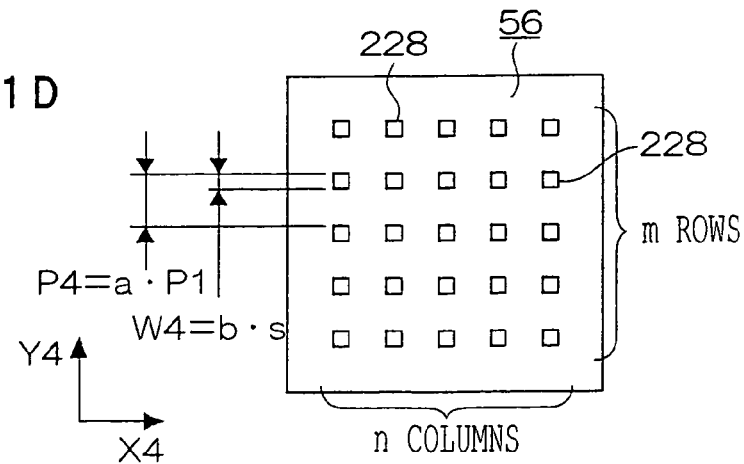

FIG. 11D shows the real images (pixel beams) 228 of the micromirrors 62 formed on the exposure plane (X4, Y4) by the second microlens array 214. The microlenses 216 of the second microlens array 214 image, on the exposure plane (X4, Y4), the respective pixel beams immediately after the pixel beams have transmitted through the apertures 212 of the aperture array 210, to form the real images. At this time, assuming that the imaging magnification is b, the pixel period becomes $P4=P3=P2=a \cdot P1$, and the pixel size becomes $W4=b \cdot s$.

(Calculation Results Based on Specific Numerical Examples)

Next, an example of calculation results of a resolving power determined by substituting specific numbers in the theoretical calculation formulae described above will be described.

In a case where the pixel period P1 is 13.7 μm and the pixel size W1 is 13.0 μm in the DMD 50 in the exposure heads 166, where the focal distances f1 and f2 of the element lenses 202 and 204 of the imaging lens system 200 are respectively 20 mm and 40 mm, where the wavelength λ of the laser beams emitted from the fiber array light source 66 is 0.4 μm, where the focal distance f3 of the microlenses 208 of the first microlens array 206 is 0.2 mm, where the dimension of one side of the apertures 212 of the aperture array 210 is s (here, s is a theoretical dimension that allows only the 0-order diffraction images to pass and where the shapes of the apertures 212 are square), and where the imaging magnification b in the formation of the real images resulting from the microlenses 216 of the second microlens array 214 is 1, the pixel size W4 and the pixel period P4 on the exposure plane (X4, Y4) are determined as follows.

a=f2/f1=40/20=2
w1=13.0 μm, P1=13.7 μm, W2=26.0 μm, P2=27.4 μm
$|X3_1|=|Y3_1|=\lambda \cdot f3/W2=0.4 \times 0.2/26.0=3.1$ μm
$s=2 \cdot |X3_1|=2 \cdot |Y3_1|=6.2$ μm
W3=s=6.2 μm, P3=P2=27.4 μm
W4=b·s=1×6.2=6.2 μm, P4=P3=27.4 μm Namely, the pixel beam size W4 on the exposure plane (X4, Y4) becomes 6.2 μm, which becomes sufficiently smaller than the pixel size W1 (=13.0 μm) of the DMD 50 and has a high resolving power.

(Effect of Improving Resolution by Slanted Scanning)

Next, specific description will be given of the effect of improving resolution in a case where the row direction of the DMD 50 is slanted by a predetermined angle θ with respect to the scanning direction.

Figure 12:
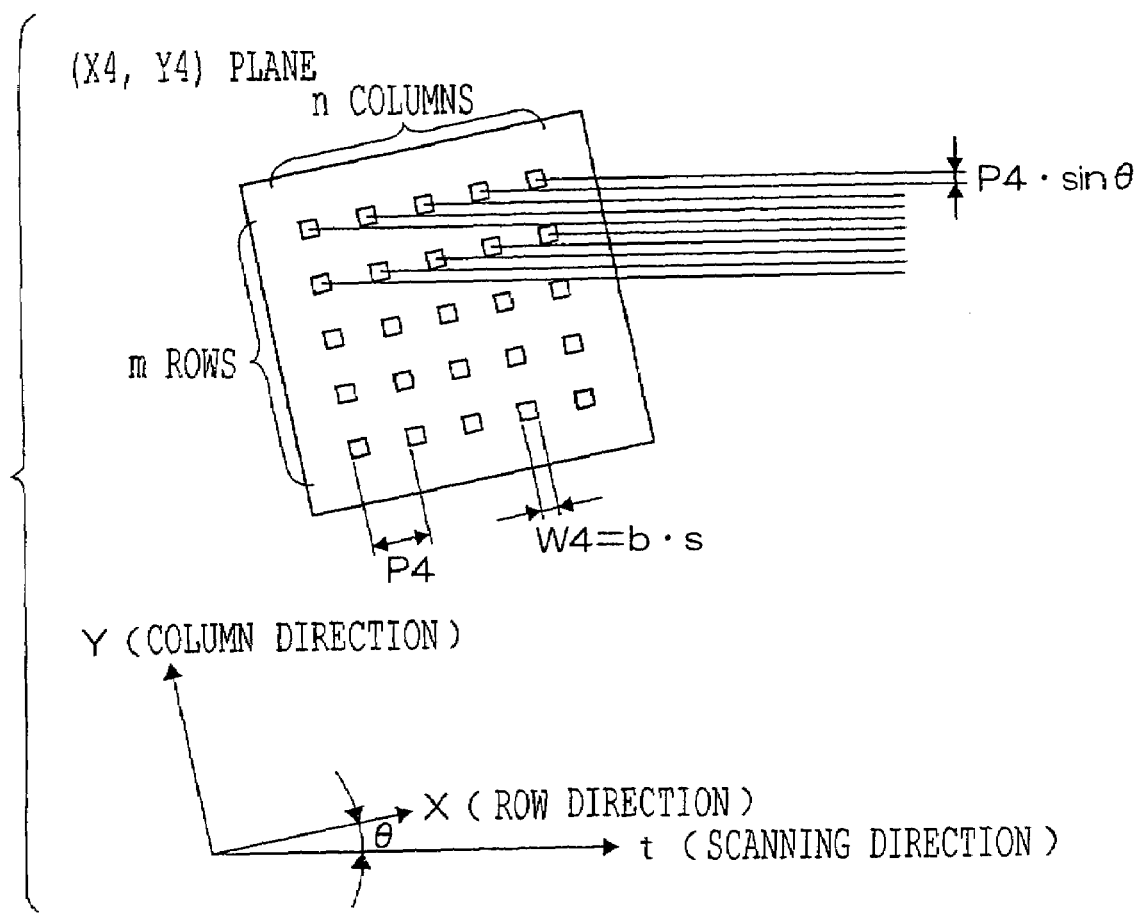
FIG. 12 is a plan view for describing the effect of improving resolution at an exposure plane (X4, Y4) in a case where the DMD is slanted with respect to a scanning direction.

The scanning mode of the pixel beams on the exposure plane (X4, Y4) 56 will be considered in regard to a case where, as shown in FIG. 12, the row direction of the DMD 50 is slanted by a predetermined angle θ where tan θ=1/n (n is the number of columns) with respect to the scanning direction.

Here, the following explanation will be given where angle θ is an angle (0°<θ<90°) formed by the row direction (arrow X direction) of the DMD 50 and the scanning direction (arrow t direction) with respect to the exposure plane 56, P4 is the pixel period on the exposure plane (X4, Y4) 56, W4 is the pixel size on the exposure plane (X4, Y4), and where the "pixel" referred to here means the unit elements of the image formed on the exposure plane (X4, Y4) by exposure of the exposure spots 228 (see FIG. 11D). It is assumed that the pixel period and the pixel size of these pixels are equivalent to the period and size of the exposure spots 228 (see FIG. 11D) imaged on the exposure plane (X4, Y4) 56.

As shown in FIG. 12, in the exposure head 166 of the present embodiment, scanning line groups of n-number resulting from pixels of n-number included in a given one row of the DMD 50 are mutually lined up at intervals of P4·sin θ, and adjacent intervals between scanning line groups of n-number resulting from pixels of n-number included in the next adjacent row also become P4·sin θ, so that scanning lines of intervals P4·sin θ are formed overall.

At this time, when the exposure pixels are modulated and controlled so that they are arranged at the same intervals as the scanning line intervals, the exposure pixel period becomes P4·sin θ. Applying the above-described numerical examples here results in the following.

θ=tan$^{-1}$(1/n)=tan$^{-1}$(0.2)=11.3°

Exposure Pixel Period=P4·sin θ=27.4×sin 11.3°=5.4 μm

Also, the exposure pixel beam size on the exposure plane (X4, Y4) 56 is W4=b·s=1×6.2 μm=6.2 μm.

Thus, appropriate exposure can be conducted with a pixel period of 5.4 μm while conducting more or less overlapping exposure with sufficiently small exposure beams of 6.2 μm. Namely, the exposure pixel period P4·sin θ=5.4 μm of the exposure plane 56 becomes sufficiently smaller than the pixel period P1=13.7 μm of the DMD 50 and has a high resolving power.

MODIFIED EXAMPLE OF MICROLENS ARRAY

In the exposure head 166 pertaining to the embodiment described above, spherical lenses are used as the microlenses 208 of the microlens array 206 and as the microlenses 216 of the microlens array 214; however, aspherical lenses such as toric lenses may be used as the microlenses of the microlens arrays 206 and 214.

By using toric lenses for the microlenses of at least one of the microlens arrays 206 and 214, it becomes possible to eliminate effects resulting from distortion of the DMD 50.

Namely, sometimes distortion occurs in the micromirrors 52 of the DMD 50, and due to this distortion, the shapes of the beams may become distorted when the light modulated by the micromirrors 52 in the ON state is condensed by the microlens array 206, so that there is the potential for the microlens array 206 is to be unable to focus the light into sufficiently small beams. In this state, there is the potential for problems to occur, such as the beam diameters cannot be condensed into sufficiently small beam diameters on the exposure plane 56, or the light which is not transmitted through the aperture 210 increases and light use efficiency drops.

Thus, in the exposure head 166 pertaining to the present embodiment, when there is the potential for such problems to occur, these problems are avoided by using microlens arrays 206 and 214 comprising aspherical lenses (here toric lenses).

Of the microlens array 206 and the microlens array 214, the downstream-side microlens array 214 may serve as the microlens array in which the toric lenses are arranged (referred to below as "toric lens array"), but it is more preferable for the beams to be modified further upstream from the aperture 210. Thus, it is preferable for the microlens array 206 to serve as the toric lens array.

In this case, there are advantages such as less eclipsing of the beams because the shapes and sizes of the beams made incident on the aperture 210 become excellent. In light of this, a case will be described where an array in which plural toric lenses are two dimensionally arranged (this will be referred to below as "the microlens array 260") is used as the microlens array disposed at the upstream side of the aperture 210.

The toric lens array used as the microlens array pertaining to the present embodiment will be described in detail.

FIG. 14 shows an example of results when the flatness of the reflection surfaces of the micromirrors 62 configuring the DMD 50 is measured. In FIG. 14, the same height positions of the reflection surfaces are shown as being joined by contour lines, and the pitch of the contour lines is 5 nm.

The x direction and the y direction shown in FIG. 14 are the two diagonal line directions of the micromirrors 62, and the micromirrors 62 are configured to rotate around rotational axes that extend in the y direction. Also, FIGS. 15A and 15B respectively show height position displacement of the reflection surfaces of the micromirrors 62 along the x direction and the y direction.

Figure 15A:
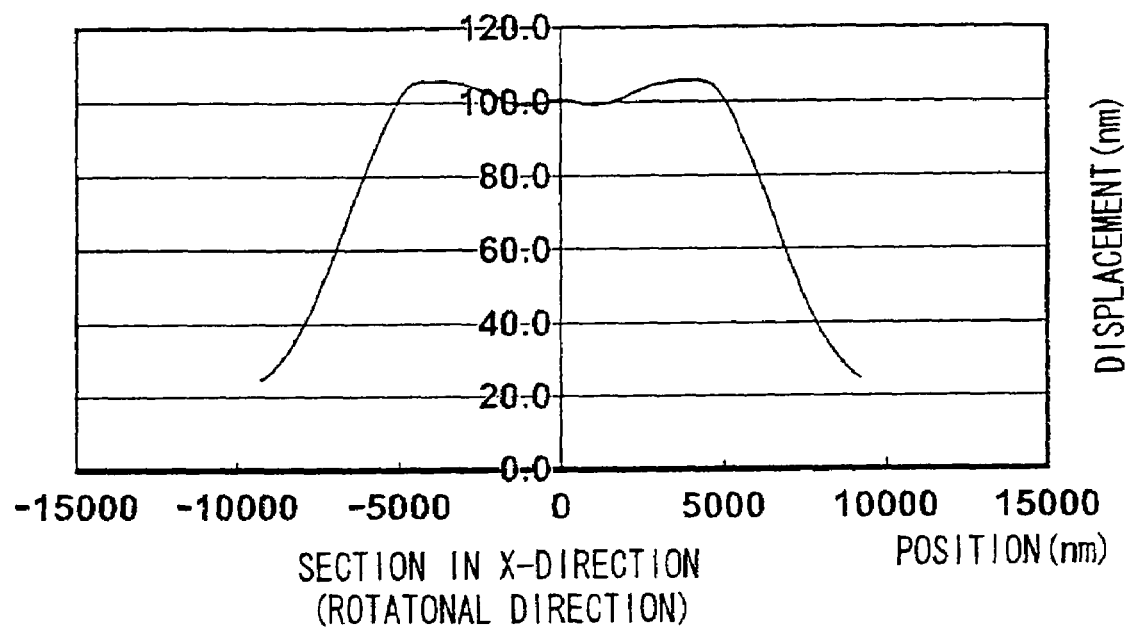
FIGS. 15A and 15B are graphs showing height position displacement of the reflection surfaces of the micromirrors shown in FIG. 14.
Figure 15B:
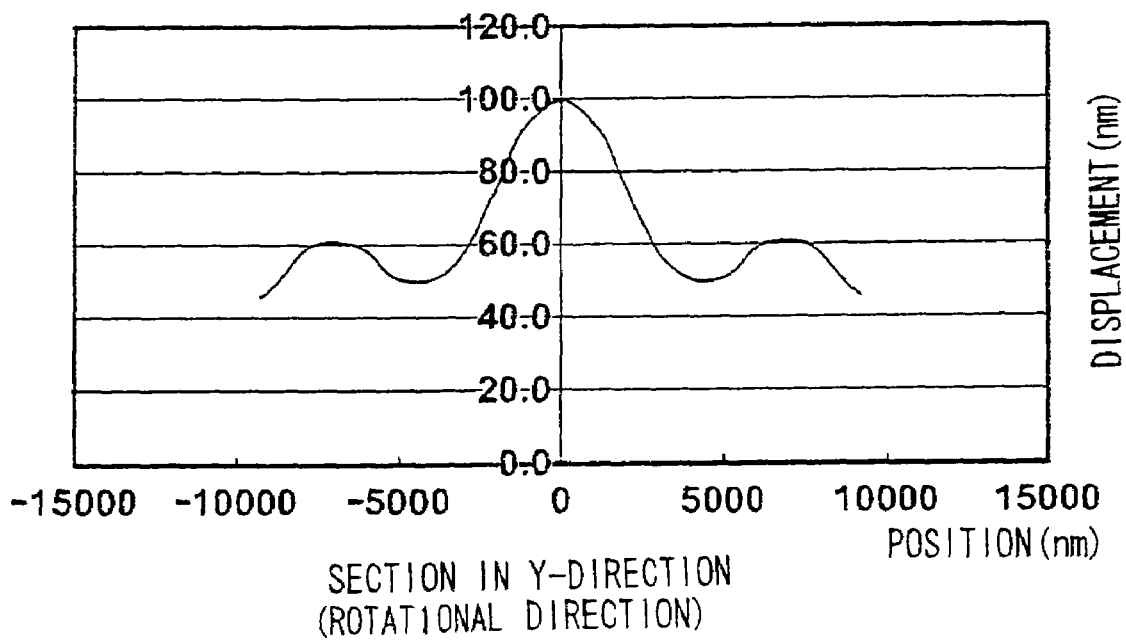

As shown in FIG. 14 and FIGS. 15A and 15B, distortion is present in the reflection surfaces of the micromirrors 62, and with particular respect to the center portions of the mirrors, the distortion in one diagonal line direction (y direction) is greater than the distortion in the other diagonal line direction (x direction). For this reason, the problem arises that the shapes at the condensing position of the laser beams (pixel beams) condensed by the spherical microlenses 208 of the microlens array 206 (see FIG. 5) are distorted.

In the exposure head 166 pertaining to the present embodiment, in order to prevent this problem, aspherical lenses (toric lenses) can be used as the microlenses 262 of the microlens array 260.

FIGS. 16A and 16B respectively show the front shape and the side shape of the microlens array using toric lenses. The dimension of each part of the microlens array 260 is also shown in these drawings, and the units of the dimension of these parts is mm.

In the present modified embodiment, (1024×256) micromirrors 62 are driven in the DMD 50, and in correspondence therewith, the microlens array 260 is constituted of a matrix of the microlenses 262 having 256 rows of the microlenses 262 in the vertical direction, with each row having 1024 microlenses 262 arranged in the horizontal direction.

In FIG. 16A, the order in which the microlens array 260 are arranged is represented by j with respect to the horizontal direction and by k with respect to the vertical direction.

FIGS. 17A and 17B respectively show the front shape and the side shape of one microlens 262 in the microlens array 260. FIG. 17A also shows the contour lines of the microlens 262. The end surface of the light-emitting side of each microlens 262 is formed as an aspherical surface shape that corrects aberration resulting from distortion of the reflection surfaces of the micromirrors 62.

More specifically, the microlenses 262 are toric lenses, and the radius of curvature (Rx) in the direction optically corresponding to the x direction is −0.125 mm, and the radius of curvature (Ry) in the direction corresponding to the y direction is −0.1 mm.

Figure 18A:
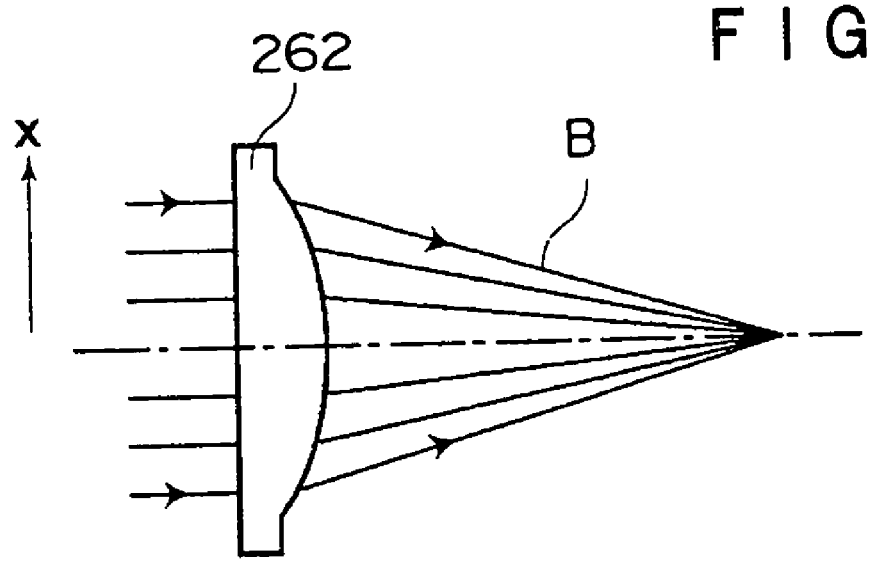
FIGS. 18A and 18B are side views showing a condensed state of pixel beams resulting from the toric lens shown in FIGS. 17A and 17B.
Figure 18B:
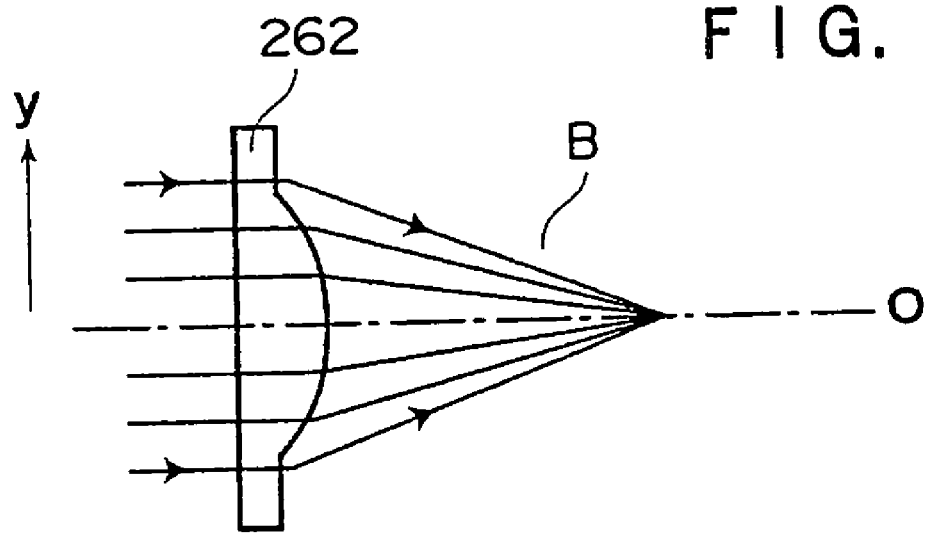
Figure 19A:
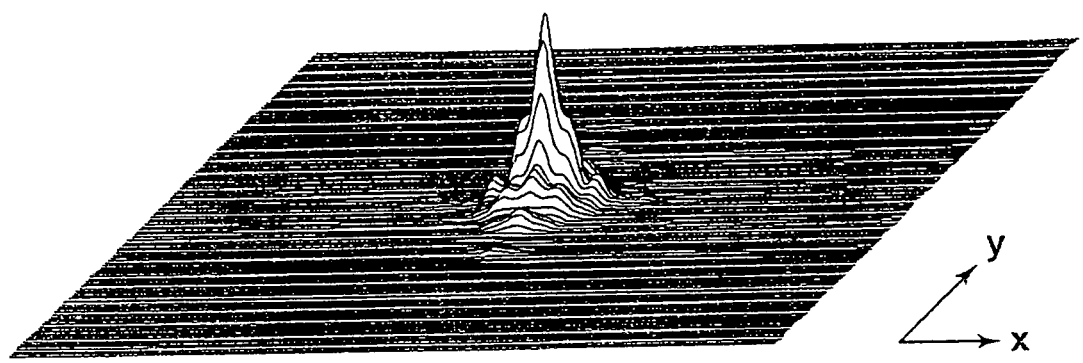
FIG. 19A is a graph showing simulation results of a beam diameter in the vicinity of a condensing position in a case where toric lenses are used as the microlenses of the microlens array, and shows a case where the distance from beam-emitting surfaces of the microlenses to an evaluation position is 0.18 mm.
Figure 19B:
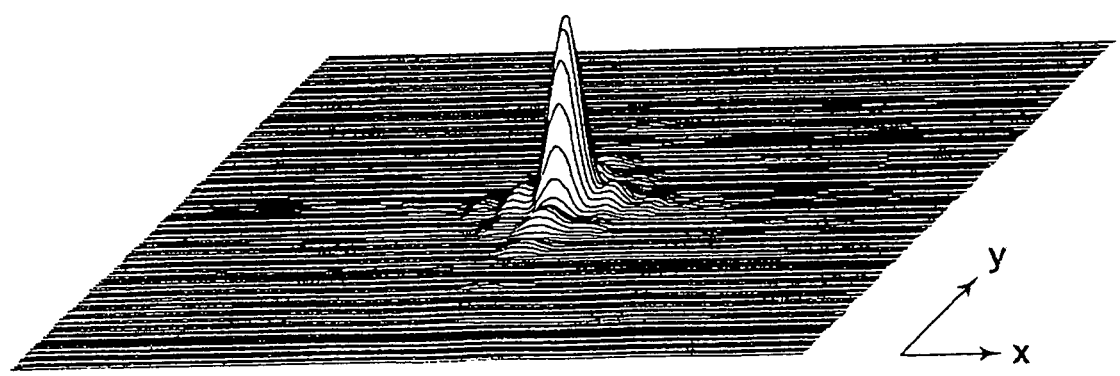
FIG. 19B is a graph showing simulation results of a beam diameter in the vicinity of the condensing position in a case where toric lenses are used as the microlenses of the microlens array, and shows a case where the distance from the beam-emitting surfaces of the microlenses to the evaluation position is 0.2 mm.
Figure 20A:
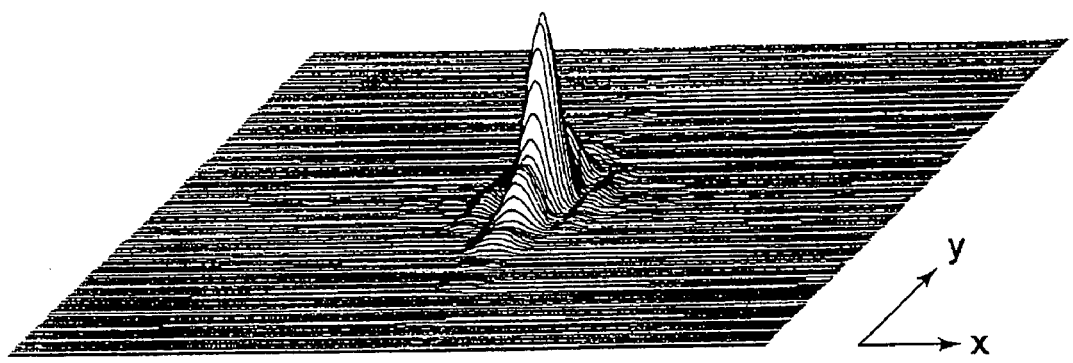
FIG. 20A is a graph showing simulation results of a beam diameter in the vicinity of the condensing position in a case where aspherical lenses are used as the microlenses of the microlens array, and shows a case where the distance from the beam-emitting surfaces of the microlenses to the evaluation position is 0.18 mm.
Figure 20B:
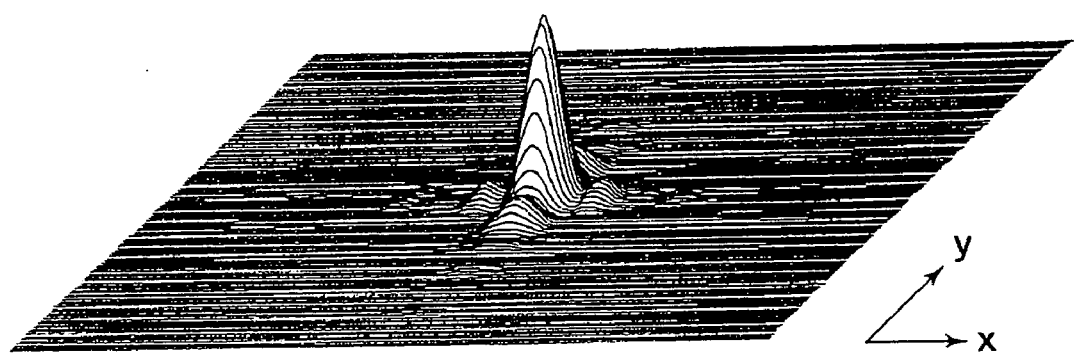
FIG. 20B is a graph showing simulation results of a beam diameter in the vicinity of the condensing position in a case where aspherical lenses are used as the microlenses of the microlens array, and shows a case where the distance from the beam-emitting surfaces of the microlenses to the evaluation position is 0.2 mm.
Figure 20C:
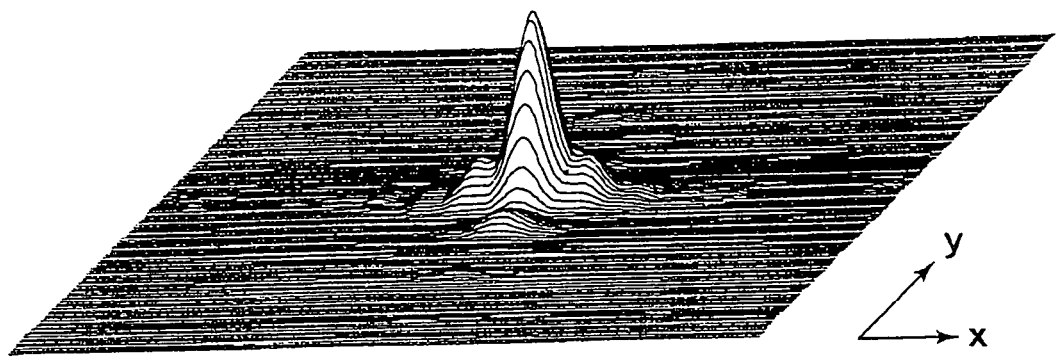
FIG. 20C is a graph showing simulation results of a beam diameter in the vicinity of the condensing position in a case where aspherical lenses are used as the microlenses of the microlens array, and shows a case where the distance from the beam-emitting surfaces of the microlenses to the evaluation position is 0.22 mm.
Figure 20D:
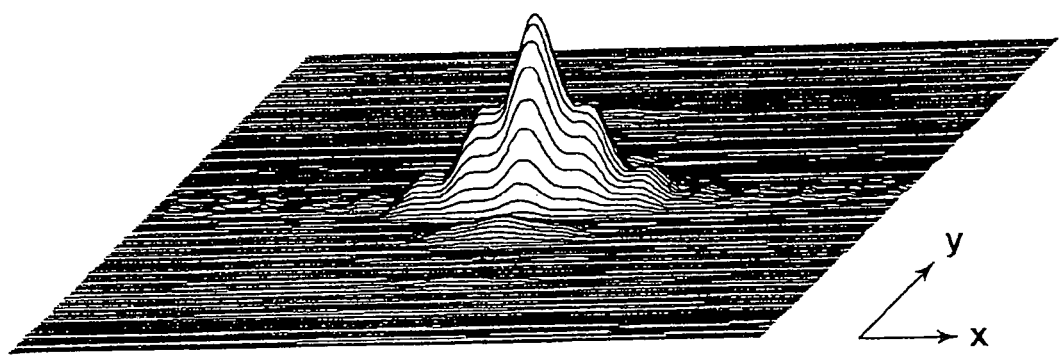
FIG. 20D is a graph showing simulation results of a beam diameter in the vicinity of the condensing position in a case where aspherical lenses are used as the microlenses of the microlens array, and shows a case where the distance from the beam-emitting surfaces of the microlenses to the evaluation position is 0.24 mm.

Thus, the condensed states of the pixel beams B in the cross section parallel to the x direction and the y direction are as shown in FIGS. 18A and 18B. In other words, if one compares the cross section parallel to the x direction with the cross section parallel to the y direction, the radius of curvature of the microlenses 262 is smaller in the cross section of the latter, and the focal distance is also shorter in the latter.

Results when the beam diameters in the vicinity of the condensing position (focal position) of the microlenses 262 in a case where the microlenses 262 have the above-described shape are simulated with a computer are respectively shown in FIGS. 19A to 19D.

Also, for purpose of comparison, results obtained when the same simulation is conducted in regard to a case where the microlenses of the microlens array have a spherical shape where the radius of curvature=Ry=−0.1 mm are respectively shown in FIGS. 20A to 20D. It should be noted that the value of z in each drawing represents the evaluation position in the focal direction of the microlenses, which position is expressed as a distance from the beam-emitting surfaces of the microlenses.

Also, the surface shape of the microlenses 262 used in these simulations is expressed by the following equation (8).

$$z = \frac{CxX^2 + CyY^2}{1 + SQRT(1 - Cx^2X^2 - Cy^2Y^2)} \quad \text{[Expression 1]}$$

In the above equation, Cx represents curvature in the x direction (=1/Rx), Cy represents curvature in the y direction (=1/Ry), X represents the distance from the lens optical axis O in relation to the x direction, and Y represents the distance from the lens optical axis O in relation to the y direction.

As is apparent when one compares FIGS. 19A to 19D with FIGS. 20A to 20D, in the exposure head 166 pertaining to the present embodiment, by using, for the microlenses 262, the toric lenses in which the focal distance in the cross section parallel to the y direction is smaller than the focal distance in the cross section parallel to the x direction, distortion of the beam shapes in the vicinity of the condensing position is suppressed. As a result, it becomes possible to expose, on the photosensitive material 150, an image in which there is substantially no distortion and which has a higher resolution.

It will also be understood that the region in which the beam diameters are small is wider, i.e., the focal depth is greater, in the case of the microlenses 262 shown in FIGS. 19A to 19D than a case where spherical lenses are used as the microlenses.

In a case in which the larger/smaller relationship between the distortion in the x direction at the center portion of the micromirror 62 and the distortion in the y direction thereat is reversed with respect to the relationship described above, the microlenses 262 may be constituted of the toric lenses in which the focal distance in the cross section parallel to the x direction is smaller than the focal distance in the cross section parallel to the y direction. Thus, in this case, it becomes possible to expose, on the photosensitive material 150, an image in which there is substantially no distortion and which has a higher resolution.

The aperture array 210 is disposed in the vicinity of the condensing position of the microlens array 260 so that only the light passing through the microlenses 262 corresponding thereto is made incident at the apertures 212 thereof. Namely, due to the fact that the aperture array 210 is disposed, the light from the adjacent microlenses 262 not corresponding thereto is prevented from being made incident at the apertures 212, so that the extinction ratio is raised.

In general, the effect of suppressing distortion of the beam shapes at the condensing position of the microlenses 262 is also obtained by reducing to a certain extent the diameters of the apertures 212 of the aperture array 210 disposed with the aforementioned purpose. In such a case, the amount of light blocked by the aperture array 210 increases and light use efficiency drops. However, when the microlenses 262 have an aspherical surface shape, light use efficiency is highly maintained because no light is blocked.

Although a case has been described here where toric lenses having a second-order aspherical surface shape are used as the microlenses 262 of the microlens array 260 in the exposure head 166 pertaining to the present embodiment, the beam shapes can be further improved by using aspherical lenses of a higher order (fourth order, sixth order, etc.).

In the microlens array 260 pertaining to the present modified example, the end surfaces of the light-emitting sides of the microlenses 262 are aspherical (toric surfaces). However, effects that are the same as those of the microlenses 262 can also be obtained when the microlens array is configured by microlenses where one of the two light-transmitting end surfaces is spherical and the other is cylindrical.

Moreover, although the microlenses 262 in the microlens array 260 pertaining to the present modified example have aspherical surface shapes that correct aberration resulting from distortion of the reflection surfaces of the micromirrors 62, the same effects can be obtained when, instead of using such aspherical surface shapes, a refractive index distribution that corrects aberration resulting from distortion of the reflection surfaces of the micromirrors 62 is given to the microlenses 262 configuring the microlens array 260.

Figure 21A:
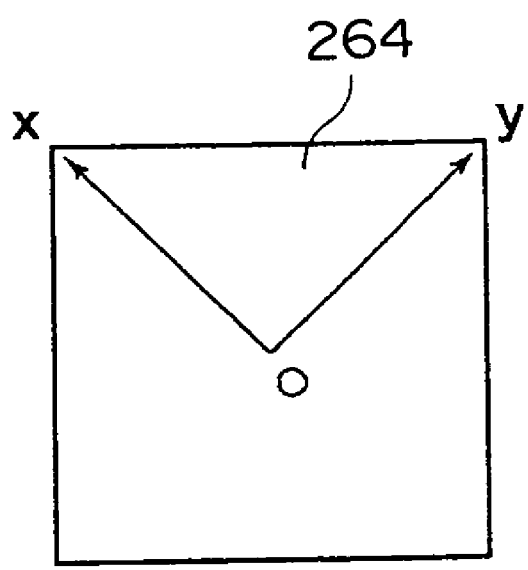
FIGS. 21A and 21B are a front view and a side view showing the configuration of a microlens in a case where a refraction index distribution is given to the microlenses of the microlens array.
Figure 21B:

FIGS. 21A and 21B show an example of such a microlens 264. FIGS. 21A and 21B respectively show the front shape and the side shape of the microlens 264. As shown in the drawings, the outer shape of the microlens 264 is a flat tabular shape. The x and y directions in FIG. 21A are as is previously described.

Figure 22A:
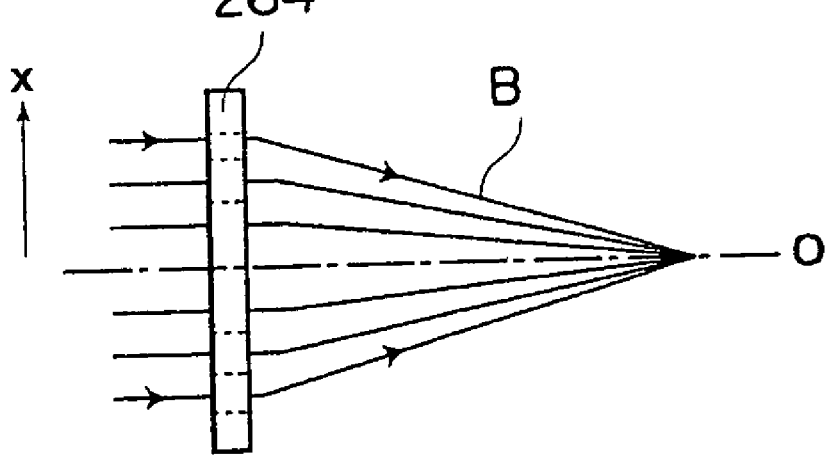
FIGS. 22A and 22B are side views showing the condensed state of pixel beams resulting from the microlens shown in FIGS. 21A and 21B.
Figure 22B:
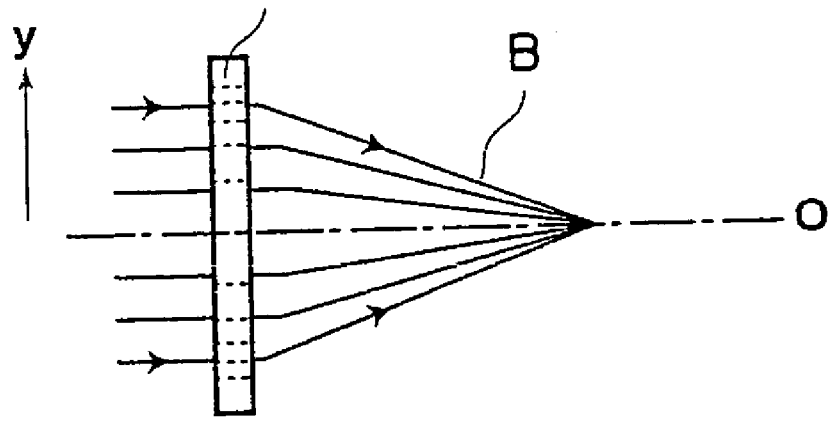

Also, FIGS. 22A and 22B schematically show the condensed state of the pixel beams B in cross sections parallel to the x direction and the y direction resulting from the microlens 264 shown in FIGS. 21A and 21B. The microlens 264 has a refractive index distribution that gradually increases from the optical axis O outward. In the drawings, the broken lines shown inside the microlens 264 show the positions at which the refractive index changes at a predetermined equal pitch from the optical axis O.

As shown in the drawings, when one compares the cross section parallel to the x direction with the cross section parallel to the y direction, the rate of change in the refractive index of the microlens 264 is greater in the latter cross section, and the focal distance is also shorter in the latter cross section. When a microlens array configured by such refractive index distribution type lenses is used, it is possible to obtain effects that are the same as those of the microlens array 260 pertaining to the present modified example.

It should be noted that the aforementioned refractive index distribution may be given to a microlens array where the surface shapes are aspherical, as in the microlenses 262 previously shown in FIGS. 17A and 17B and FIGS. 18A and 18B, so that aberration resulting from distortion of the reflection surfaces of the micromirrors 62 is corrected by both the surface shape and the refractive index distribution.

Further, it is acceptable that microlens 266 as shown in FIGS. 23A and 23B is employed in place of the microlens 262 of FIGS. 17A and 17B. The distribution of the contour lines of the microlens 266 corresponds to the distribution of the contour lines of the microlens 262 observed when the microlens 262 has been rotated around the optical axis in accordance with a change in the direction of distortion of the micromirrors of the DMD 50. In short, in the present embodiment, it is possible to design the microlens and/or modify the manner of mounting the microlens such that an optimum distribution of the contour lines of the microlens, which distribution corresponds to the distortion of the DMD 50, is obtained.

In the present embodiment, a case has been desscribed where the microlens array 260 comprising aspherical lenses is used as the microlens array disposed at the upstream side of the aperture 210. However, the microlens array 216 comprising spherical lenses may be used as the microlens array disposed at the upstream side of the aperture 210, and a microlens array comprising aspherical lenses may be used as the microlens array disposed at the downstream side of the aperture 210.

In this case, there is the potential for eclipsing of the incident beams by the aperture 210 to increase somewhat, but similar to the case where the microlens array 260 is disposed at the upstream side of the aperture 210, the beam shapes and sizes on the exposure plane 56 can be made excellent.

Also, a microlens array comprising aspherical lenses may be used for both of the two microlens arrays respectively disposed at the upstream and downstream sides of the aperture 210, so that aberration resulting from distortion of the micromirrors 62 is corrected at both the upstream and downstream sides of the aperture 210.

(Modified Example of Exposure Head)

Next, an exposure head pertaining to a modified example of the embodiment of the invention will be described.

Figure 13:
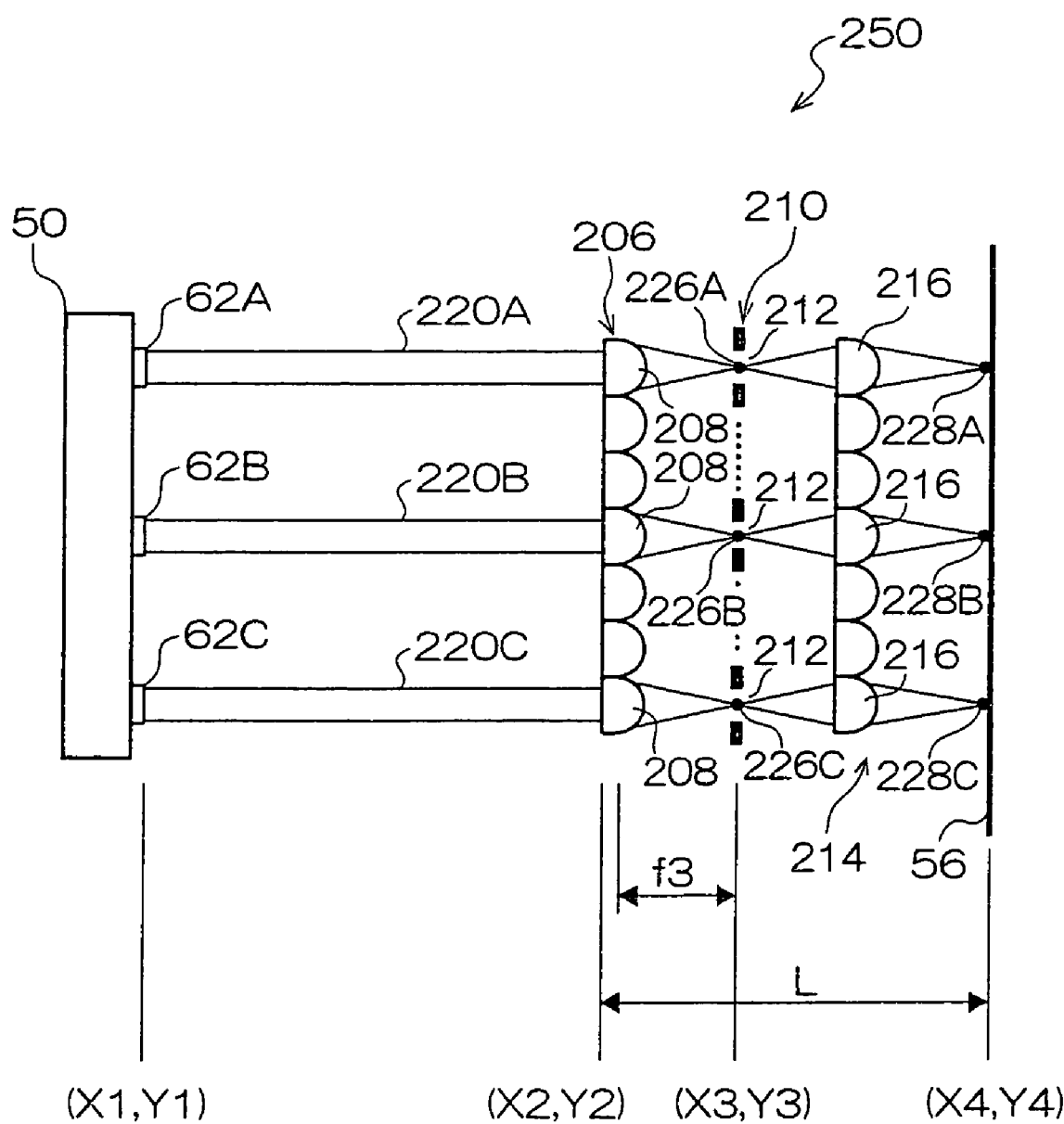
FIG. 13 is a side view showing the configuration of an optical system disposed at the light-reflecting side of a DMD in an exposure head pertaining to a modified example of the embodiment of the invention.

FIG. 13 shows the configuration of the light-reflecting side of a DMD in the exposure head 250 pertaining to the modified example of the invention. The exposure head 250 pertaining to this modified example is different from the exposure head 166 shown in FIG. 5 in that the imaging lens system 200 is omitted.

In the exposure head 250 shown in FIG. 13, the pixel beams 220A, 220B and 220C from micromirrors 62A, 62B and 62C of the DMD 50 are substantially collimated, and these pixel beams 220A, 220B and 220C are made incident at the microlenses 208 of the first microlens array 206 to form the Fraunhofer diffraction images 226A, 226B and 226C at the focal positions of the microlenses 208.

These diffraction images 226A, 226B and 226C are passed through the aperture array 210 including the apertures 212 of the same size as the 0-order diffraction images, whereby the diffraction images, from which the noise components have been removed, are made incident at the microlenses 216 of the second microlens array 214.

Thus, similar to the case of FIG. 5, the real images 228A, 228B and 228C are formed as exposure beam spots on the exposure plane (X4, Y4) 56. In the exposure head 250, with respect to the exposure heads 166 shown in FIG. 5, optical characteristics that are substantially the same as the case where the imaging lens system 200 of the magnification a is 1 can be obtained.

The exposure head 250 pertaining to the modified example described above can be preferably used in a case where the distance from the DMD 50 to the exposure plane 56 is short, and can omit the imaging lens system 200, as compared with the exposure head 166. Thus, the number of parts of the device is reduced, manufacturing costs are reduced, and miniaturization of the device becomes possible.

In the exposure head 250 pertaining to the present modified example, at least one of the two microlens arrays respectively disposed at the upstream side and the downstream side of the aperture array 210 may be a microlens array comprising aspherical lenses such as toric lenses, so that aberration resulting from distortion of the reflection surfaces of the micromirrors 62 is corrected by the microlens array comprising the aspherical lenses.

(Standardization of High Resolution Conditions)

Next, standardized conditions for obtaining high resolution will be described in a case where the exposure plane 56 is scanned and exposed using the exposure heads 166 and 250 pertaining to the embodiment of the invention described above.

[1] Exposure Beam Size and Scanning Line Interval

The exposure beam size W4 is determined by the following equation (9).

$$W4 = b \cdot W3 = b \cdot s = b \cdot (2\lambda \cdot f3/W2) = b \cdot (2\lambda \cdot f3/a \cdot W1) = 2b \cdot \lambda \cdot f3/a \cdot W1 \quad (9)$$

Also, the scanning line interval in a case where scanning and exposure are conducted in the direction of angle θ (wherein tan θ=1/n) with respect to the row direction including pixels of n-number of the DMD 50 is determined by the following equation (10).

$$P4 \cdot \sin \theta = a \cdot P1 \cdot \sin[\tan^{-1}(1/n)] = a \cdot P1 \cdot (1/n) = a \cdot P1/n \quad (10)$$

[2] Standardized Conditional Expressions for Obtaining High Resolution

In order to obtain high resolution, it is necessary for the conditions described in any of the following (a) to (c) to be fulfilled.

(a) The exposure beam size must be equal to or less than the original pixel size of the spatial light modulator; namely, $W4 \leq W1$.

From the above (9), $2b \cdot \lambda \cdot f3/a \cdot W1 \leq W1$.

Thus, $2b \cdot \lambda \cdot f3 \leq a \cdot W1^2$.

(b) The scanning line interval must be equal to or less than the exposure beam size.

Namely, $P4 \cdot \sin \theta \leq W4$.

From the above (10), $a \cdot P1/n \leq 2b \cdot \lambda \cdot f3/a \cdot W1$.

Thus, $a^2 \cdot P1 \cdot W1/n \leq 2b \cdot \lambda \cdot f3$.

(c) The above conditional expressions of (a) and (b) must be established at the same time.

Namely, $a^2 \cdot P1 \cdot W/n \leq 2b \cdot \lambda \cdot f3 \leq a \cdot W1^2$.

It should be noted that, in the exposure head 250 shown in FIG. 13, standardized conditions for obtaining high resolution can be obtained by making a=1 in the above (a) and (b).

Description was given only of a case where the DMD 50 was used as the spatial light modulator in the exposure heads 166 and 250 of the present embodiment. However, a device other than the DMD 50 can also be applied as the spatial light modulator as long as the device is one where the laser beams emitted from the optical fiber light source 66 are divided into plural pixel beams (light beam groups) of a desired pixel pitch and where these pixel beams can be selectively modulated to either the exposure state or the non-exposure state.

For example, an MEMS (Micro Electro Mechanical Systems) type spatial modulator, an optical element (PLZT element) that modulates transmitted light using an electro-optical effect, and a liquid crystal optical shutter (LCD) can also be applied. However, it is necessary, for the illumination optical system for obtaining the light beam groups that are spatial-light-modulated per pixel, to be individually optimized depending on the type of spatial light modulator.

Also, it is not essentially necessary for the spatial light modulator to be one where pixels such as micromirrors are two-dimensionally arranged. The modulator may also be one where the pixels are one-dimensionally arranged, i.e., where pixels of n-number are linearly arranged in a row direction.

Also, in the exposure heads 166 and 250 pertaining to the present embodiment, the real images of the spatial light modulator formed at the incident plane of the first microlens array 206 may be equal-magnification images (i.e., imaging lens system 200 magnification a=1) or magnified images (i.e., a>1), and it is also possible to set the imaging magnification b resulting from the microlenses 216 of the second microlens array 214 to be a value other than 1.

Although the microlens arrays 206 and 214 were used in the exposure heads 166 and 250 pertaining to the present embodiment, the micro-focusing elements are not limited to the microlens arrays 206 and 214 including the refraction type microlenses 208 and 216. It suffices that the micro-focusing elements are micro-focusing elements having beam focusability. For example, a GRIN (graded-index) microlens array, a diffraction type microlens array such as a hologram and a reflection type micro-concave reflection mirror array can also be applied.

As described above, according to the exposure head of the invention, optical pattern information displayed by a spatial light modulator can be exposed with high resolving power and high resolution across a wide exposure area.

Specifically, according to the exposure head of the invention, in an exposure head in which the pixel size of a spatial light modulator is reduced per pixel using a microlens array to obtain a high resolving power, and which scans an exposure plane along a straight line forming a constant angle θ (0°<θ<90°) with respect to one pixel column of the spatial light modulator, to raise exposure density and improve high resolution:

(1) Noise components such as scattering components included in light illuminating the spatial light modulator and cross-talk components generated by diffraction and scattering from the spatial light modulator are almost completely blocked, whereby high-resolution exposure beams can be obtained;

(2) Working distance is secured by spatially transmitting the exposure beams to another plane, and an actual exposure object can be disposed on the plane to which the exposure beams have been transmitted; and (3) The above (2) can be realized at a low cost and in a small space.

What is claimed is:

1. An exposure head that relatively moves along a scanning direction with respect to an exposure plane and is for two-dimensionally exposing the exposure plane with a bundle of light beams arranged along a row direction orthogonal to the scanning direction, the exposure head comprising:
   a spatial light modulator where plural pixel portions whose light modulation states respectively change in correspondence to control signals are one-dimensionally or two-dimensionally arranged, which spatial light modulator divides light beams made incident thereon from a light source portion into plural pixel beams using the plural pixel portions, and selectively modulates the respective plural pixel beams into one of an exposure state and a non-exposure state;
   an imaging lens system disposed downstream of the spatial light modulator along the traveling direction of the pixel beams;
   a first micro-focusing element array disposed downstream of the imaging lens system, where plural first micro-focusing elements are arranged so as to correspond to the plural pixel portions of the spatial light modulator;
   an aperture array that is disposed in the vicinity of a rear-side focal plane of the first micro-focusing elements at which the first micro-focusing elements form Fraunhofer diffraction images of the pixels beams modulated to the exposure state by the spatial light modulator, and in which aperture array plural apertures that respectively correspond to the plural first micro-focusing elements are arranged, and which aperture array allows only main portions of the Fraunhofer diffraction images to be transmitted through the apertures; and
   a second micro-focusing element array disposed downstream of the aperture array, that includes plural second micro-focusing elements arranged so as to correspond to the plural apertures and which array forms, on the exposure plane, real images of the pixel beams respectively transmitted through the plural apertures by using the plural second micro-focusing elements.

2. The exposure head of claim 1, further comprising:
   an imaging lens system disposed between the spatial light modulator and the micro-focusing element arrays,
   wherein the spatial light modulator and the first micro-focusing element array are disposed so that an emission plane of the pixel beams in the pixel portions and a plane on which the pixel beams are incident, of the first micro-focusing element array, are in a mutually conjugate positional relation with respect to the imaging lens system.

3. The exposure head of claim 2, wherein the apertures have a size and shape that substantially allow only 0-order diffraction images of the Fraunhofer diffraction images emitted from the first micro-focusing elements to be transmitted therethrough, and
   when P1 represents a pixel period of the plural pixel portions in the spatial light modulator, W1 represents pixel size, n represents the pixel number of the pixel portions arranged along the row direction substantially orthogonal to the scanning direction,
   f3 represents the focal distance of the first micro-focusing elements,
   b represents the optical magnification with which the second micro-focusing elements form, on the exposure plane, real images of the pixel beams transmitted through the apertures,
   a represents the magnification with which the imaging lens system images, on the incident plane of the pixel beams in the first micro-focusing element array, real image on the emission plane of the pixel beams in the pixel portions,
   $\lambda$ represents the wavelength of the light beams emitted from the light source, and
   $\tan^{-1}(1/n)$ represents an angle formed by the row direction and the scanning direction,
   P1, W1, n, f3, b, a and $\lambda$ satisfy one of the following equations (4) to (6):

$$2b \cdot \lambda \cdot f3 \leq a \cdot W1^2 \quad (4)$$

$$a^2 \cdot P1 \cdot W1/n \leq 2b \cdot \lambda \cdot f3 \quad (5)$$

$$a^2 \cdot P1 \cdot W1/n \leq 2b \cdot \lambda \cdot f3 \leq a^2 \cdot W1^2 \quad (6).$$

4. The exposure head of claim 3, wherein the size of the apertures is $2\lambda \cdot f3/a \cdot W1$.

5. The exposure head of claim 1, wherein the apertures have a size and shape that substantially allow only 0-order diffraction images of the Fraunhofer diffraction images formed by the first micro-focusing elements to be transmitted therethrough.

6. The exposure head of claim 1, wherein the apertures have a size and shape that substantially allow only 0-order diffraction images of the Fraunhofer diffraction images formed by the first micro-focusing elements to be transmitted therethrough, and
   when P1 represents a pixel period of the plural pixel portions in the spatial light modulator, W1 represents pixel size, n represents the pixel number of the pixel portions arranged along the row direction substantially orthogonal to the scanning direction,
   f3 represents the focal distance of the first micro-focusing elements,
   b represents the optical magnification with which the second micro-focusing elements form, on the exposure plane, real images of the pixel beams transmitted through the apertures, and
   $\lambda$ represents the wavelength of the light beams emitted from the light source portion, and
   $\tan^{-1}(1/n)$ represents an angle formed by the row direction and the scanning direction,
   P1, W1, n, f3, b an $\lambda$ satisfy one of the following equations (1) to (3):

$$2b \cdot \lambda \cdot f3 \leq W1^2 \quad (1)$$

$$P1 \cdot W1/n \leq 2b \cdot \lambda \cdot f3 \quad (2)$$

$$P1 \cdot W1/n \leq 2b \cdot \lambda \cdot f3 \leq W1^2 \quad (3).$$

7. The exposure head of claim 6, wherein the size of the apertures is $2\lambda \cdot f3/W1$.

8. The exposure head of claim 1, wherein at least one of the first micro-focusing elements and the second micro-focusing elements are aspherical lenses.

9. The exposure head of claim 8, wherein the first micro-focusing elements are aspherical lenses.

10. The exposure head of claim 9, wherein the aspherical lenses are toric lenses.

11. An exposure head that relatively moves along a scanning direction with respect to an exposure plane and is for two-dimensionally exposing the exposure plane with a bundle of light beams arranged along a row direction orthogonal to the scanning direction, the exposure head comprising:

a spatial light modulator where plural pixel portions whose light modulation states respectively change in correspondence to control signals are one-dimensionally or two-dimensionally arranged, which divides light beams made incident thereon from a light source portion into plural pixel beams using the plural pixel portions, and which selectively modulates the respective plural pixel beams into one of an exposure state and a non-exposure state;

an imaging lens system disposed downstream of the spatial light modulator along the traveling direction of the pixel beams;

a first micro-focusing element array disposed downstream of the imaging lens system, including first micro-focusing elements that are arranged so as to correspond to the plural pixel portions of the spatial light modulator and so as to form Fraunhofer diffraction images of the pixel beams modulated to the exposure state by the spatial modulator;

an aperture array in which plural apertures that respectively correspond to the plural first micro-focusing elements are arranged, and which allows only main portions of the Fraunhofer diffraction images to be transmitted therethrough via the apertures; and a second micro-focusing element array disposed downstream of the aperture array, that includes plural second micro-focusing elements arranged so as to correspond to the plural apertures and which array forms, on the exposure plane, real images of the pixel beams respectively transmitted through the plural apertures by using the plural second micro-focusing elements, wherein when W1 represents the size of the pixel portions in the spatial light modulator and W4 represents the beam size on the exposure plane, W4≦W1.

12. The exposure head of claim 11, wherein the Fraunhofer diffraction images are formed by the second micro-focusing elements in the vicinity of a rear-side focal plane thereof, and the apertures are arranged in the vicinity of the rear-side focal plane.

13. The exposure head of claim 11, wherein the apertures have a size and shape that substantially allow only 0-order diffraction images of the Fraunhofer diffraction images formed by the first micro-focusing elements to be transmitted therethrough, and when P1 represents a pixel period of the plural pixel portions in the spatial light modulator, n represents the pixel number of the pixel portions arranged along the row direction substantially orthogonal to the scanning direction, f3 represents the focal distance of the first micro-focusing elements, b represents the optical magnification with which the second micro-focusing elements form, on the exposure plane, real images of the pixel beams transmitted through the apertures, and λ represents the wavelength of the light beams emitted from the light source portion, the following equation (1) is satisfied:

$$2b \cdot \lambda \cdot f3 \leq W1^2 \qquad (1).$$

14. The exposure head of claim 13, wherein the size of the apertures is 2λ·f3/W1.

15. The exposure head of claim 11, wherein an imaging lens system disposed between the spatial light modulator and the micro-focusing element arrays, wherein the spatial light modulator and the first micro-focusing element array are disposed so that an emission plane of the pixel beams in the pixel portions and a plane on which the pixel beams are incident, of the first micro-focusing element array, are in a mutually conjugate positional relation with respect to the imaging lens system.

16. The exposure head of claim 15, wherein the apertures have a size and shape that substantially allow only 0-order diffraction images of the Fraunhofer diffraction images emitted from the micro-focusing elements to be transmitted therethrough, and when P1 represents a pixel period of the plural pixel portions in the spatial light modulator, n represents the pixel number of the pixel portions arranged along the row direction substantially orthogonal to the scanning direction, f3 represents the focal distance of the first micro-focusing elements, b represents the optical magnification with which the second micro-focusing elements form, on the exposure plane, real images of the pixel beams transmitted through the apertures, a represents the magnification with which the imaging lens system images, on the incident plane of the pixel beams in the first micro-focusing element array, real images on the emission plane of the pixel beams in the pixel portions, and λ represents the wavelength of the light beams emitted from the light source portion, the following equation (4) is satisfied:

$$2b \cdot \lambda \cdot f3 \leq a \cdot W1^2 \qquad (4).$$

17. The exposure head of claim 16, wherein the size of the apertures is 2λ·f3/a·W1.

18. An exposure head that relatively moves along a scanning direction with respect to an exposure plane and is for two-dimensionally exposing the exposure plane with a bundle of light beams arranged along a row direction orthogonal to the scanning direction, the exposure head comprising:

a spatial light modulator in which plural pixel portions whose light modulation states respectively change in correspondence to control signals are one-dimensionally or two-dimensionally arranged, which spatial light modulator divides light beams made incident thereon from a light source portion into plural pixel beams using the plural pixel portions, and selectively modulates the respective plural pixel beams into one of an exposure state and a non-exposure state;

an imaging lens system disposed downstream of the spatial light modulator along the traveling direction of the pixel beams;

a first micro-focusing element array disposed downstream of the imaging lens system, including first micro-focusing elements that are arranged so as to correspond to the plural pixel portions of the spatial light modulator and so as to form Fraunhofer diffraction images of the pixel beams modulated to the exposure state by the spatial modulator;

an aperture array in which plural apertures that respectively correspond to the plural first micro-focusing elements are arranged, and which allows only main portions of the Fraunhofer diffraction images to be transmitted therethrough via the apertures; and a second micro-focusing element array disposed downstream of the aperture array, that includes plural second micro-focusing elements arranged so as to correspond to the plural apertures, which array forms, on the exposure plane, real images of the pixel beams respectively transmitted through the plural apertures by using the plural second micro-focusing elements, wherein scanning line intervals on the exposure plane are equal to or less than the beam size on the exposure plane.

19. The exposure head of claim 18, wherein the Fraunhofer diffraction images are formed by the first micro-focusing elements in a vicinity of a rear-side focal plane thereof and the apertures are disposed in the vicinity of the rear-side focal plane.

20. The exposure head of claim 18, wherein the apertures have a size and shape that substantially allow only 0-order diffraction images of the Fraunhofer diffraction images formed by the first micro-focusing elements to be transmitted therethrough, and when P1 represents a pixel period of the plural pixel portions in the spatial light modulator, W1 represents pixel size, n represents the pixel number of the pixel portions arranged along the row direction substantially orthogonal to the scanning direction, f3 represents the focal distance of the first micro-focusing elements, b represents the optical magnification with which the second micro-focusing elements form, on the exposure plane, real images of the pixel beams transmitted through the apertures, λ represents the wavelength of the light beams emitted from the light source portion, and $\tan^{-1}(1/n)$ represents an angle formed by the row direction and the scanning direction, the following equation (2) is satisfied:

$$P1 \cdot W1/n \leq 2b \cdot \lambda \cdot f3 \tag{2}$$

21. The exposure head of claim 20, wherein the size of the apertures is $2\lambda \cdot f3/W1$.

22. The exposure head of claim 18, wherein an imaging lens system disposed between the spatial light modulator and the micro-focusing element arrays, wherein the spatial light modulator and the first micro-focusing element array are disposed so that an emission plane of the pixel beams in the pixel portions and a plane on which the pixel beams are incident, of the first micro-focusing element array, are in a mutually conjugate positional relation with respect to the imaging lens system.

23. The exposure head of claim 22, wherein the apertures have a size and shape that substantially allow only 0-order diffraction images of the Fraunhofer diffraction images emitted from the micro-focusing elements to be transmitted therethrough, and when P1 represents a pixel period of the plural pixel portions in the spatial light modulator, W1 represents pixel size, n represents the pixel number of the pixel portions arranged along the row direction substantially orthogonal to the scanning direction, f3 represents the focal distance of the first micro-focusing elements, b represents the optical magnification with which the second micro-focusing elements form, on the exposure plane, real images of the pixel beams transmitted through the apertures, a represents the magnification with which the imaging lens system images, on the incident plane of the pixel beams in the first micro-focusing element array, the real images on the emission plane of the pixel beams in the pixel portions, and λ represents the wavelength of the light beams emitted from the light source portion, $\tan^{-1}(1/n)$ represents an angle formed by the row direction and the scanning direction, and the following equation (5) is satisfied:

$$a^2 \cdot P1 \cdot W1/n \leq 2b \cdot \lambda \cdot f3 \tag{5}$$

24. The exposure head of claim 23, wherein the size of the apertures is $2\lambda \cdot f3/a \cdot W1$.

* * * * *